United States Patent
Van Kampen et al.

(10) Patent No.: US 9,529,571 B2
(45) Date of Patent: Dec. 27, 2016

(54) SIMD MEMORY CIRCUIT AND METHODOLOGY TO SUPPORT UPSAMPLING, DOWNSAMPLING AND TRANSPOSITION

(75) Inventors: David Van Kampen, Eindhoven (NL); Kees Van Berkel, Heeze (NL); Sven Goossens, Eindhoven (NL); Wim Kloosterhuis, Waalre (NL); Claudiu Zissulescu-Ianculescu, Eindhoven (NL)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 805 days.

(21) Appl. No.: 13/253,754

(22) Filed: Oct. 5, 2011

(65) Prior Publication Data
US 2013/0091339 A1    Apr. 11, 2013

(51) Int. Cl.
*G06F 7/78* (2006.01)
*H03H 17/06* (2006.01)
*H03H 17/02* (2006.01)

(52) U.S. Cl.
CPC .......... *G06F 7/785* (2013.01); *H03H 17/0261* (2013.01); *H03H 17/0621* (2013.01); *H03H 2017/0298* (2013.01)

(58) Field of Classification Search
CPC .................................................. G06F 15/8076
USPC .............................................. 712/4; 708/313
See application file for complete search history.

(56) References Cited

U.S. PATENT DOCUMENTS

| | | | |
|---|---|---|---|
| 4,939,642 A * | 7/1990 | Blank ............... | 712/22 |
| 5,428,627 A | 6/1995 | Gupta | |
| 5,600,582 A | 2/1997 | Miyaguchi | |
| 5,942,996 A | 8/1999 | Scarangella et al. | |
| 5,946,039 A * | 8/1999 | Ben-Arie et al. .......... | 348/403.1 |
| 6,088,782 A * | 7/2000 | Lee et al. .......................... | 712/4 |
| 7,610,453 B1 * | 10/2009 | Parekh et al. ................. | 711/154 |
| 2003/0061527 A1 * | 3/2003 | Haycock et al. ............. | 713/600 |
| 2004/0172517 A1 * | 9/2004 | Prokopenko et al. ............ | 712/4 |
| 2004/0267856 A1 * | 12/2004 | Macy, Jr. ............ | G06F 9/30014 708/524 |
| 2007/0011442 A1 | 1/2007 | Hussain | |

(Continued)

FOREIGN PATENT DOCUMENTS

JP    59-184957 A    10/1984

OTHER PUBLICATIONS

Freescale Semiconductor, "AltiVec Technology Programming Interface Manual", Jun. 1999, ALTIVECPIM/D Rev. 0, See vector merge, vector permute instructions, 4 pages.*

(Continued)

*Primary Examiner* — Eric Coleman
(74) *Attorney, Agent, or Firm* — Patent Portfolio Builders PLLC

(57) ABSTRACT

An apparatus and method for creation of reordered vectors from sequential input data for block based decimation, filtering, interpolation and matrix transposition using a memory circuit for a Single Instruction, Multiple Data (SIMD) Digital Signal Processor (DSP). This memory circuit includes a two-dimensional storage array, a rotate-and-distribute unit, a read-controller and a write to controller, to map input vectors containing sequential data elements in columns of the two-dimensional array and extract reordered target vectors from this array. The data elements and memory configuration are received from the SIMD DSP.

32 Claims, 19 Drawing Sheets

(56) References Cited

U.S. PATENT DOCUMENTS

2007/0070079 A1* 3/2007 Chung et al. ............... 345/582
2009/0119479 A1* 5/2009 Kleihorst et al. ............. 712/10
2011/0271078 A1* 11/2011 Dai et al. .................... 712/29

OTHER PUBLICATIONS

Goossens, S.L.M., "An SIMD register file with support for dual-phase decimation and transposition", Jun. 2010, 67 pages.*
"Color depth", Aug. 30, 2010, Wikipedia, 5 pages.*
Chang, Hoseok et al. "Access-Pattern-Aware On-Chip Memory Allocation for SIMD Processors", IEEE Transactions on Computer-Aided Design of Integrated Circuits and Systems, vol. 28, No. 1, pp. 158-163, Jan. 2009.
Ahn, Jaewoo et al. "SIMD Processor Based Implementation of Recursive Filtering Equations", In Proceedings IEEE Workshop on Signal Processing Systems (SiPS), Tampere, Finland, 87-92, Oct. 2009.
Dang, B.L. et al., "Efficient Filtering with the Co-Vector Processor", In Proceedings of PRORISC '03, pp. 351-356, Nov. 2003.
Shahbahrami, A., "Avoiding Conversion and Rearrangement Overhead in SIMD Architectures", Dissertation, 2008.
Lee, H. et al., "A Low-Power DSP for Wireless Communications", IEEE Transactions on Very Large Scale Integration (VLSI) Systems, Sep. 2010, vol. 18, No. 9, pp. 1310-1322.
International Search Report mailed Feb. 6, 2013, in related International Application No. PCT/EP2012/069657.
S.L.M. Goossens, "An SIMD register file with suppport for dual-phase decimation and transposition", Master Thesis Eindhoven University of Technology, the Netherlands, Jul. 1, 2011, XP055051553 Retrieved from the Internet: URL:http://alexandria.tue.nl/extral/afstversl/wsk-i/goossens2010.pdf.
Y. Jung et al., "A Register File with Transposed Access Mode", ICCD 2000, Sep. 17-20, 2000, pp. 559-560, XP10520155.
Park, J.W.; "Multiaccess memory system for attached SIMD computer"; IEEE Transactions and Computers, vol. 53, Issue 4; Apr. 2004; pp. 439-452.
Aho, E.; "Design and Implementation of Parallel Memory Architectures"; Dr. Tech. Thesis; Tampere University of Technology, 2006; Finland.
Shahbahrami, A., et al.; "Matrix Register File and Extended Subwords: Two Techniques for Embedded Media Processors"; Proceedings of the 2nd Conference on Computing Frontiers, ACM; 2005; pp. 171-179.
Hlanounik, B.; "Linear-time matrix transpose algorithms using vector register file with diagonal registers"; Proceedings of 15th International Parallel and Distributed Processing Symposium; Apr. 2001; pp. 1530-2075.
Jayasena, N.; "Stream Register Files with Indexed Access"; Proceedings of the 10th International Symposium on High Performance Computer Architecture; 2004; 11 pages.

* cited by examiner

SIMD MEMORY CIRCUIT AND METHODOLOGY TO SUPPORT UPSAMPLING, DOWNSAMPLING AND TRANSPOSITION

TECHNICAL FIELD

The invention relates to a Single Instruction, Multiple Data (SIMD) memory circuit and method of use.

BACKGROUND

In a relatively short period of time the demand for high speed, integrated wireless telecommunication services has increased rapidly. Currently, a number of third and fourth generation wireless communication standards have emerged, e.g. Universal Mobile Telecommunications System/time-division duplexing (UMTS/TDD), Universal Mobile Telecommunications System/frequency-division duplexing (UMTS/FDD), Time Division Synchronous Code division Multiple Access (TD-SCDMA), etc. Single Instruction, Multiple Data (SIMD), is a class of parallel computers that has been used to facilitate wireless communications due to the large amount of data that must be accessed and manipulated. As illustrated in FIG. 1, computers with multiple parallel processor elements 100, i.e. vector Digital Signal Processors (DSPs), simultaneously perform the same operation retrieved from a common instruction pool 120 on multiple data elements obtained from a data pool 130. Thus, such SIMD machines exploit data level parallelism. The data pool 130 and common instruction pool 120 may be volatile or non-volatile memory or any data storage device that is readable by a computer system.

Application specific processors, i.e. Application-Specific Integrated Circuits (ASICs), for decimation or similar algorithms typically have only limited flexibility, i.e. limited support for variation of the algorithm's parameters, which make it difficult to deploy them in multi-standard transceivers. Further, their hardware cannot be reused for other functions. Still further, they are not updatable, which would be useful to debug their functionality or extend their functionality when standards or products evolve.

Classical DSP based solutions don't have the aforementioned limitations of ASICs. However, due to their processing of one element at a time, such DSPs would have to run at too high clock frequencies to still be able to support these applications in a power-efficient manner.

Vector DSPs can exploit data parallelism. The sample based decimation filtering approach has one important cause for reduced efficiency: the number of filter coefficients K is not necessarily a multiple of P. Further, intra-vector addition is also a required operation, which can be an issue. For block based filtering on a vector DSP, the creation of the required base set of M down-sampled vectors, e.g. through reordering, is a complex and time consuming task for a vector DSP. This task can be considered as overhead to the decimation filtering proper and therefore should be kept to a minimum.

A vector DSP having a memory accessible in two dimensions can be used to prepare M base vectors to which iteratively new samples are appended. They cannot, however, provide the desired target vectors for decimation filters with K>P from their memory directly. Secondly, parallel filling of the memory and reading out for different software pipeline stages is only possible if both reading and writing is supported in both directions. An important loss of efficiency is seen since the same data samples are loaded multiple times.

To overcome the shortcomings of the related art an extension of a programmable vector processor is needed. A programmable processor gives flexibility, typically at the expense of increased area and power consumption relative to dedicated hardware solutions.

Further, the problem of decimation filtering algorithms is their non-consecutive memory access. It needs vectors of a downsampled signal stream. These can be created in many ways with various (specialized) memory circuits or devices (e.g. using registers and shuffle units on the Embedded Vector Processor (EVP) itself). However, there is an increased tradeoff in complexity/flexibility of these memory circuits and the remaining overhead/load/costs for the processor in generating the target decimated vectors.

An article summarizing many alternative multi-access memory systems: (Park J. W., "Multiaccess memory system for attached SIMD computer", IEEE Transactions on Computers, Volume: 53, Issue: 4, April 2004, pages: 439-452 incorporated herein in its entirety by reference) provides various conflict-free memory access patterns for reading/writing vectors of data. A conflict-free access enables single cycle memory access. There are memory circuits that support conflict-free writing of a vector of P elements into a column of a virtual array of P×P elements. With additional support of conflict-free reading of a vector of P elements from a row of this virtual array, one can generate decimated vectors. Other memory circuits directly provide strided memory access (i.e. down sampling) in a virtual array of 1×(P×P) elements.

Still further, decimation and interpolation filtering have another problem, symmetries in the filter coefficient sequence, which is typical for these filters cannot be exploited for any K. So these implementations will do maximally one filter coefficient per multiplication operation instead of two. Depending on the processor's VLIW resource configuration, the throughput is therefore about half of what is theoretically possible. Thirdly, source samples are typically reloaded from memory during the processing.

For block based filtering on a vector processor the creation of the required base set of M down-sampled vectors, e.g. through reordering, is a complex and time consuming task. With support of a two dimensionally accessible memory the efficiency already improves, by reducing the load of this overhead. However, through the present invention, this process can be made even more efficient than with a basic 2D memory. Still, exploiting symmetries of the filter coefficient array with any two dimensionally accessible memory of size P×P is a problem. This is because the target sample vectors of both mirror coefficients cannot easily be derived from the same base vector, as the shift distance in the down-sampled stream is larger than one sample. Only for K<=P, symmetric filters can be efficiently supported as these target vectors are stored in the memory. Again, for K>P, depending on the processor's VLIW resource configuration, the throughput is therefore about half of what is theoretically possible.

The implementation of such memory circuits supporting the aforementioned memory operations are however complex and expensive. They typically have besides (at least) P independently writable/indexable banks both a rotator at the input/write port and a rotator per read port.

The above information disclosed is only for enhancement of understanding of the background of the invention and therefore it may contain information that does not form the prior art that is already known to a person of ordinary skill in the art.

SUMMARY

An exemplary embodiment of the present invention relates to a configurable memory circuit for a Single Instruction, Multiple Data (SIMD) Digital Signal Processor (DSP), for generating reordered output vectors from sequential input data vectors. This memory circuit includes a rotate-and-distribute unit to rotate and distribute an input data vector and a two-dimensional register file to receive and store vectors generated by the rotate-and-distribute unit. A write controller is used to control the mapping of input data elements in the two-dimensional register file, corresponding to a mapping configuration by configuring the rotate-and-distribute unit and generating write-enable signals for all cells of the two-dimensional register file. Finally, a read controller is used to select, on a per column basis, one data element to be received in the output vector, corresponding to the mapping configuration.

Further, the present invention provides for a method for generating reordered output vectors from sequential input data vectors utilizing a configurable memory circuit for a Single Instruction, Multiple Data (SIMD) Digital Signal Processor (DSP) having a rotate-and-distribute unit, a two-dimensional register file, a write controller and a read controller. This method begins by rotating and distributing an input data vector by the rotate-and-distribute unit generating output vectors and receiving and storing the target vectors generated by the rotate-and-distribute unit in the two-dimensional register file. Thereafter, the step of controlling the mapping of input data elements in the two-dimensional register file corresponding to a mapping configuration by configuring the rotate-and-distribute unit and generating write-enable signals for all cells of the two-dimensional register file is performed, and the selecting on a per column basis one data element to be received in the output vector, corresponding to the mapping configuration by the read controller.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 11 is a table illustrating the variable word width features of the present invention generated by the embodiment of the present invention shown in FIGS. 5, 7 and 8 of the present invention for rotate-and-distribute circuit 270 according to FIGS. 6A-6B;

FIG. 16 is a table illustrating the variable word width features generated by the embodiment of the present invention shown in FIGS. 5, 7 and 8 of the present invention for rotate-and-distribute circuit 270 according to FIGS. 6C-6D.

DETAILED DESCRIPTION

Figure 1:
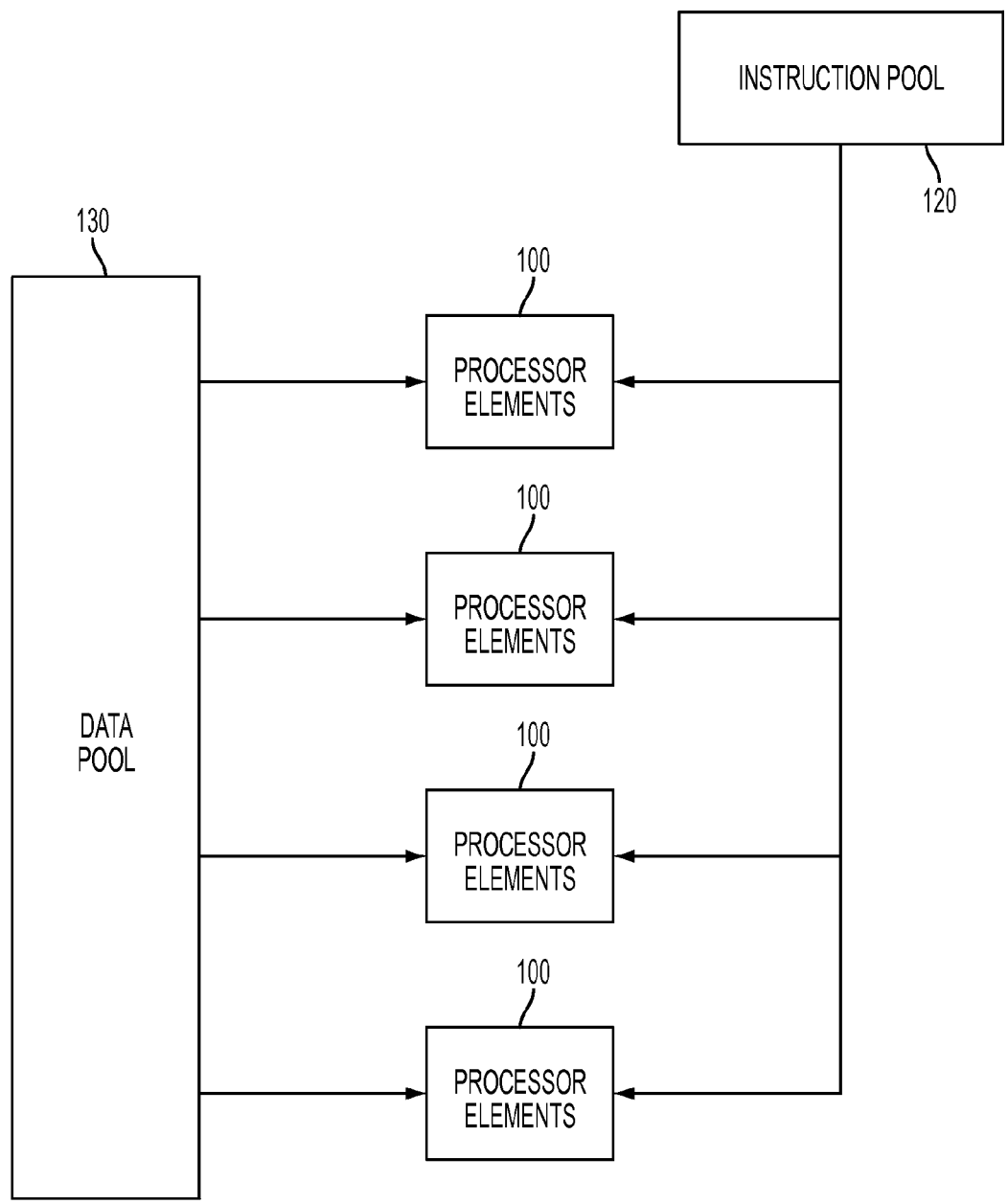
FIG. 1 is a general systems diagram of a conventional Single Instruction, Multiple Data (SIMD) computer system.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Also, when an element is referred to as being "connected to" another element, it can be directly connected to another element or be indirectly connected to another element with one or more intervening elements interposed therebetween. Hereinafter, like reference numerals refer to like elements.

Further, whenever software or computer programs are referred to in reference to the drawings these items may include, but not limited to, algorithms, software, firmware, applets, programming code or languages, and code segments which are stored on a computer readable medium and executable on a computer or other processor-based apparatus.

Several factors are important in the design of such SIMD machines when used for wireless communications. Decimation, i.e. low-pass anti-alias filtering combined with down-sampling, is an important function in digital wireless communication. In digital front end (DFE) subsystems of wireless receivers for modern standards like IEEE 802.11a- n, UMTS, Long-Term Evolution (LTE), the load of decimation is a dominant factor. Therefore, it is important that its implementation is power and cost efficient. For multi-standard transceiver solutions, flexibility of the decimation chain of the transceiver is another highly desired property.

The formula for the output of a decimating Finite Impulse Response (FIR) filter is:

$$y[m] = \sum_{i=0}^{K-1} h[K-1-i]x[mM+i] \quad \text{Equation 1}$$

In Equation 1, output element y[m] is calculated by weighing a sequence of K samples of input signal x[n] with coefficients h[k] and summing them. Output elements y[m], are based on an input sample sequence with an offset that is a multiple of M, where M is the decimation or down sampling factor.

Another important characteristic of implementations of a decimating FIR filter is the non-sequential data access patterns. Other algorithms found in the wireless communication domain with the same characteristic are: signal-up and down-sampling, interpolation, i.e. spectral image filtering combined with signal-up sampling, fractional sample-rate conversion and matrix transposition, where the latter can be considered as a special case of down-sampling.

Decimation and interpolation filters are typically characterized by an impulse response with linear phase. For digital filter processing this implies a symmetric filter coefficient sequence, i.e. h[n] is equal to h[K−1−n], which may be exploited in some implementations of the filtering algorithm: the number of multiplications can be halved, by replacing multiplications of two samples belonging to the same coefficient value with one addition and one multiplication.

Implementations of decimation and interpolation algorithms often have a polyphase filter structure, meaning the decomposition into M, respectively L, parallel subfilters. Each subfilter filters a down-sampled version of the input stream x[n], with different start offset.

Decimation and similar algorithms can be implemented, either using application specific integrated circuits or using programmable DSPs. In addition, any type of processing device mat be used. As discussed above, SIMD DSPs that operate on vectors of data can exploit the available data level parallelism in these algorithms. SIMD DSPs may have support for load operations of memory words that are not aligned on a vector boundary. With this capability, it is possible to implement decimation in a "sample based" approach, i.e. a direct implementation of equation 1, where in each iteration, a single output value of the low-pass filter operation is calculated, by filtering a consecutive array of K samples. A vector of P output elements is thus produced in P iterations. This implementation requires support for intra-vector addition, i.e. addition of all P elements from a vector.

Alternatively, vector DSPs can implement decimation in a "block based" approach, if they have some support for loading/creating vectors from non-sequential samples. In the filter step, a vector of P output elements is produced in K iterations, where in each iteration, a scalar filter coefficient is multiplied with a down-sampled signal vector, with a specific start offset. The corresponding equation is, $$\begin{bmatrix} y_{m+0} \\ y_{m+1} \\ y_{m+2} \\ \vdots \\ y_{m+P-1} \end{bmatrix} = h_{K-1} \begin{bmatrix} x_{M(m+0)} \\ x_{M(m+1)} \\ x_{M(m+2)} \\ \vdots \\ x_{M(m+P-1)} \end{bmatrix} + \quad \text{Equation 2}$$

$$h_{K-2} \begin{bmatrix} x_{M(m+0)+1} \\ x_{M(m+1)+1} \\ x_{M(m+2)+1} \\ \vdots \\ x_{M(m+P-1)+1} \end{bmatrix} + \ldots + h_0 \begin{bmatrix} x_{M(m+0)+(K-1)} \\ x_{M(m+1)+(K-1)} \\ x_{M(m+2)+(K-1)} \\ \vdots \\ x_{M(m+P-1)+(K-1)} \end{bmatrix}$$

The main advantages of block based decimation on a vector DSP are that the algorithm scales very well with K and that it does not need intra-vector addition.

As indicated in Equation 2, every $M^{th}$ iteration uses a down-sampled version of the input signal x[n] with the same start offset, only time shifted with the down-sample step M. This is visualized in FIG. 2 using shading/hashing of the boxes around input vectors with the same start offset. There are M down-sampled streams with a different start offset. A decimation algorithm may be implemented where at the start of the processing of a block M base vectors are created. Thereafter, for each filter iteration, a new sample must be appended to a sample vector and the oldest sample is removed.

Figure 2:
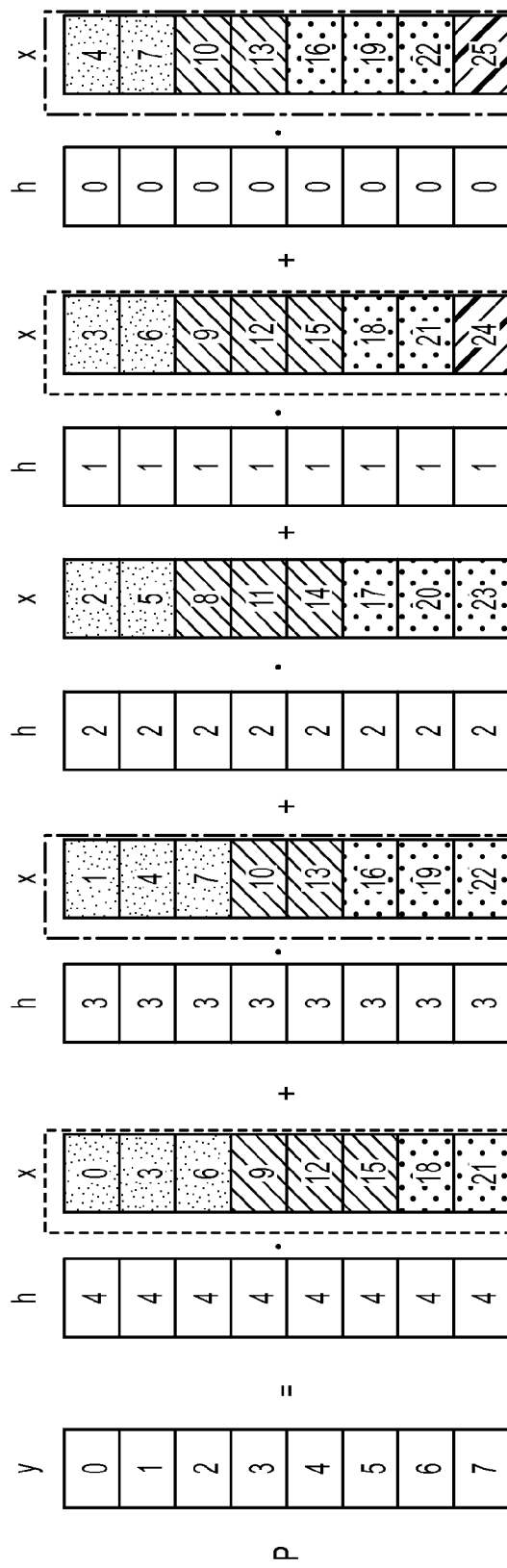
FIG. 2 is an implementation of a block-based processing decimation algorithm depicting the manipulation of a two-dimensional data array systems which may be executed using the SIMD computer system illustrated in FIG. 1.

FIG. 2 is an example of a block based decimation algorithm with M=3, K=5, P=8. Note that there are M base vectors that are a down-sampled version of the input signal with factor M and a different start offset. All the input vectors can be derived by shifting new samples into the base vector.

Figure 3:
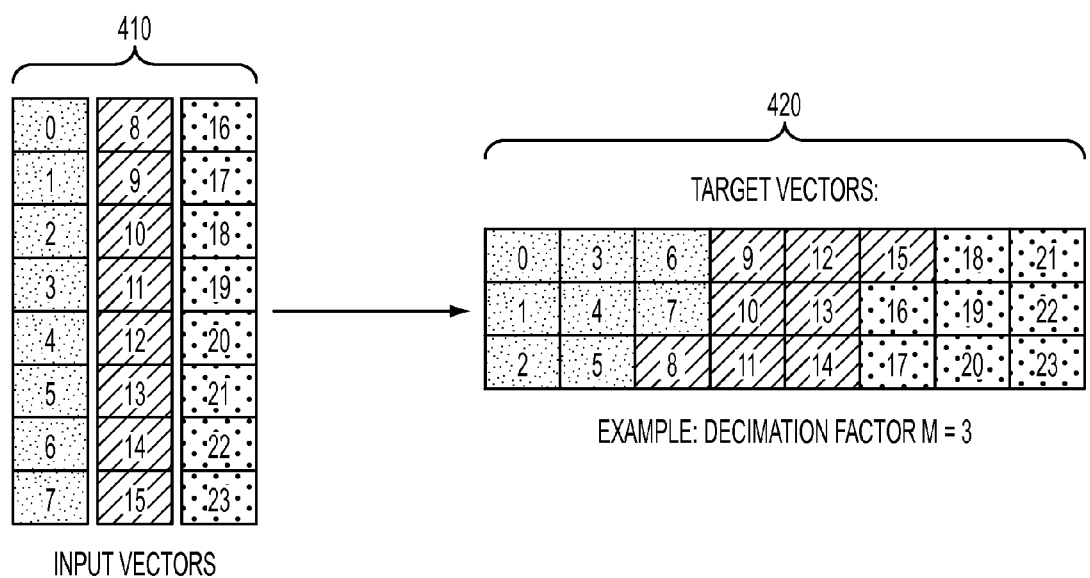
FIG. 3 is an implementation of an exemplary configuration of reordered target vectors created from sequential input vectors for decimation.

Further, as exemplified in FIG. 3, the formula for relating M target down-sampled vectors (with decimation factor M, variable start offset in the sample stream) from M consecutive input vectors (starting at an arbitrary point in the sequential input stream):

```
for i: 0.. M−1
    for j: 0..P−1
        vector_index = floor((j*M+i)/P)
        element_index = (j*M+i)%P
        target_vector[i][j] = input_vector[s][vector_index]
                              [element_index]
    end
end
```

In which j*M+i is the index in the M consecutive input vectors combined into one array. Interpolation, i.e. up-sampling followed by image filtering, has SIMD implementation problems similar to decimation, because of non-sequential element ordering. The polyphase decomposed implementation uses L block-based (sub) filters of length K/L. Each of these L filters gives as output a decimated version of the desired output signal, only with a different start offset. The output vectors of the L subfilters have to be interleaved to form L output vectors of the desired output signal. This interleaving problem is similar to the generation of down-sampled vectors for decimation filtering.

Figure 4:
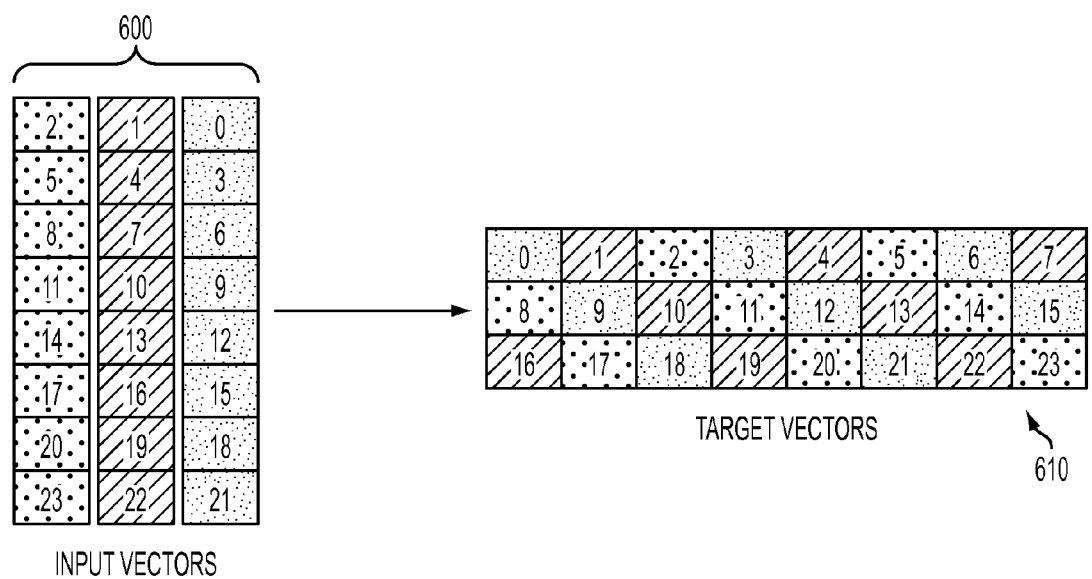
FIG. 4 is an implementation of an exemplary configuration of reordered target vectors created from sequential input vectors for interpolation.

As illustrated in FIG. 4, the interpolation algorithm receives an input vector where the target vectors can be related to input vector using the following algorithm:

```
for i: 0..M-1
    for j: 0..P-1
        vector_index = (i*P+j)%M
        element_index = floor((i*P+j)/M)
        target_vector[i][j] = input_vector[vector_index]
                                          [element_index]
    end
end
```

For a more detailed explanation of the aforementioned interleaving problem, see S. L. M. Goossens—"An SIMD register file with support for dual-phase decimation and transposition", (M.Sc. Thesis, T U Eindhoven. June 2010, conducted at ST-Ericsson/DSP-IC), herein after referred to as Goossens and incorporated herein by reference in its entirety.

Vector DSPs typically come without support for loads of vectors with non-sequential memory elements to make the target vectors for block based filtering. There can be support for vector element shuffling and mask based selection of elements from two vectors, which is sufficient to create the desired target vectors. An Embedded Vector Processor (EVP) is an example of one such processor element 100.

Some vector DSPs have limited transposition support. Special register files for transposition have been proposed (see Shahbahrami, Juurlink, Vassiliadis; "Matrix register file and extended subwords: two techniques for embedded media processors"; Proceedings of the $2^{nd}$ conference on Computing Frontiers, ACM, 2005: and Jung, Berg, Kim, Kim "A register file with transposed access mode"; Proceeding of International Conference on Computer Design, 2000, incorporated herein by reference in their entireties), having both a row and column wise access mode. In principle, having a memory that is accessible in two dimensions is sufficient to generate down-sampled target vectors. First, P vectors are stored in one dimension, each with P samples from a continuous input signal and a relative offset of M samples between their first elements. Second, P target vectors can be read out from the other dimension. Note that block level software pipelining can be supported if both reading and writing is supported in both row and column direction. Per iteration the direction in which data is stored and the direction in which it is read out is changed. Another specialized register file designed for transposition uses diagonal write and read patterns as further described in Hanounik, Hu; "Linear-time matrix transpose algorithms using vector register file with diagonal registers"; Proceedings of 15th International Parallel and Distributed Processing Symposium, incorporated herein in its entirety by reference. Further, Jayasena, Erez, Ahn, and Dally; "Stream register files with indexed access"; Proceedings of the $10^{th}$ International Symposium on High Performance Computer Architecture, 2004, incorporated herein in its entirety by reference, proposes a conflict resolving register file used by multiple stream processors with indexed access modes. It exploits an SRAM like structure of register file for indexing per bank, but that does not translate well to vector processing.

As discussed, a basic 2D memory circuit, configured with P rows and P columns, in which the input data is strictly written is one column at a time, can be used to generate target vectors. From P input vectors written in columns of the 2D memory, P target vectors can be obtained, by reading rows in the 2D memory. Exemplary embodiments are directed to dimensioning the number of columns of the incorporated 2D memory circuit as P rows and P+E columns and providing one or two extended read ports that are able to select P elements out of P+E elements and give it a proper alignment in the output vector. Thus more than P target vectors can be generated with the memory. For a basic 2D memory extended with E columns, M(1+E)+(P−M) target vectors can be extracted from P+E source vectors. For the memory circuits of the present invention, higher efficiencies can be obtained. An exemplary embodiment will be discussed where M(1+E) target vectors can be extracted from M+ceil(ME/P) source vectors. Even higher efficiencies are possible under certain conditions for other embodiments.

With the proposed extensions, for certain filter lengths (K<=M(1+E)+(P−M) for a basic 2D memory respectively K<=M(1+E)) all desired target vectors for block based symmetric decimation filtering are available in the memory after the input vector store phase. Having two read ports allows the parallel reading out of two target vectors, specifically the target vectors that are to be multiplied with the coefficients h[i] and h[K−1−i], that have the same value because of symmetry. Both the storage capacity and the read port bandwidth enable a very efficient implementation of symmetric block based filtering on certain VLIW vector DSPs. In the key loop the reading out of two down-sampled target vectors, the addition of two target vectors (of the previous read step) and a multiply accumulate operation can go in parallel. By processing two filter coefficients per cycle, block based decimation filtering with the invented PE×P 2D memory, can have twice the throughput of implementations using a P×P 2D memory.

Hereinafter, configurations and operations of exemplary embodiments according to the present invention will be described in detail with reference with the accompanying drawings.

A parallel memory system (or multi-access memory circuit) for strided memory access, of which some embodiments are effectively rotator free is described herein.

According to exemplary embodiments, described in further detail in reference to specific figures discussed below, the memory circuit 200 (of FIG. 5) with data storage capability integrated, is accessible in two dimensions, with its controller and the underlying method of storing and loading data into it, supports efficient creation of down-sampled vectors for block based decimation filtering, interpolation and matrix transposition. Through M vector stores in memory circuit 200, followed by M vector loads, M target vectors are obtained.

Figure 5:
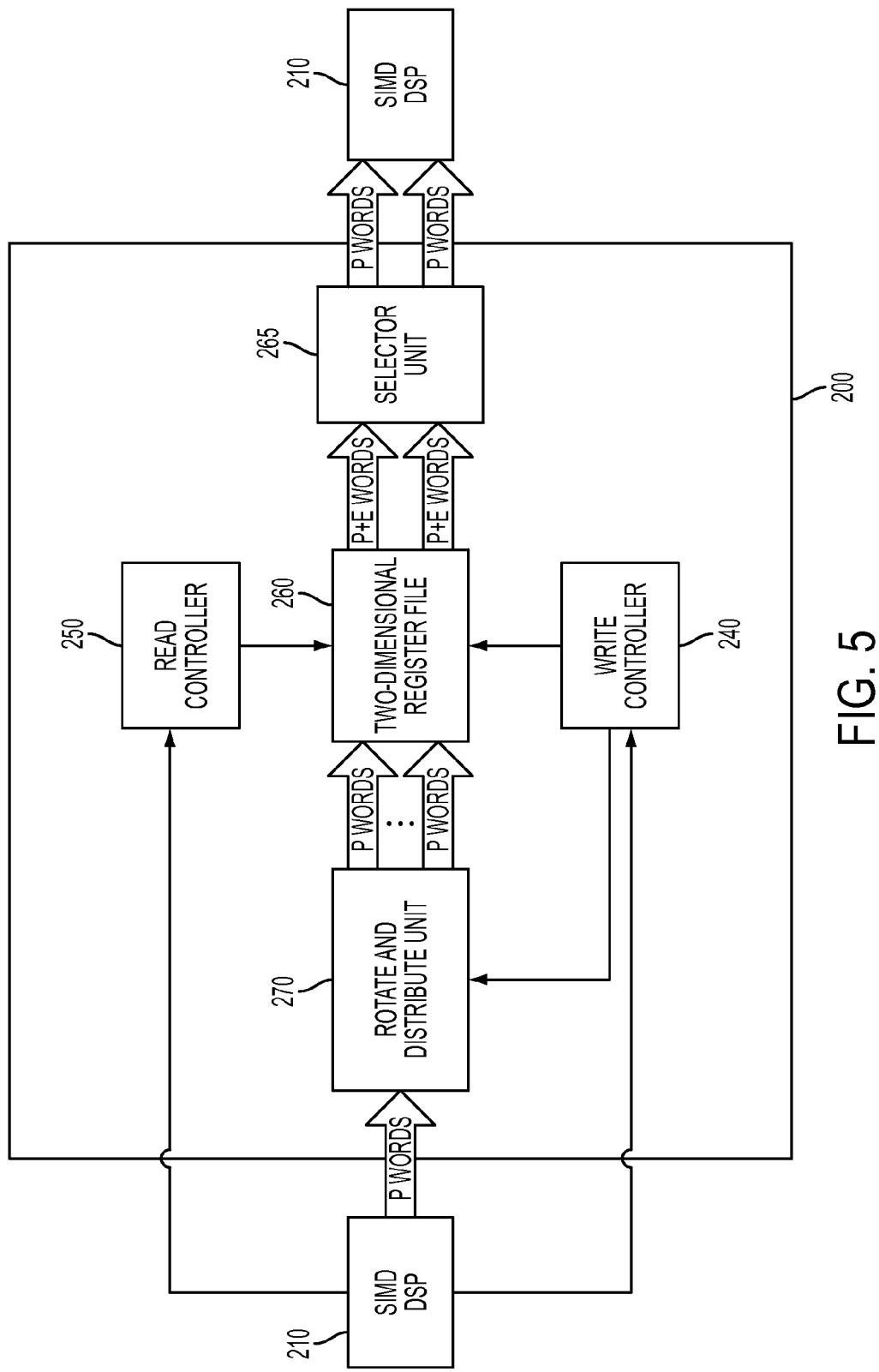
FIG. 5 is a diagram illustrating the memory circuit 200 of an exemplary embodiment of the present invention.

Referring to FIGS. 5 and 6A-6D, it should be noted that FIGS. 6A-6D illustrate alternative embodiments of a rotate and distribute unit 270 shown in FIG. 5.

FIG. 5 includes a number of SIMD DSP(s) 210, a rotate and distribute unit 270. A two-dimensional register file 260, a read controller 250 and a write controller 240 are provided.

Vertical alignment of elements occurs at multiples of the decimation factor in memory circuit 200. There is spreading of the input vector over multiple columns and this flow is repeated per write operation as seen from SIMD DSP 210.

The rotation offset is a function of M and P, the software pipeline stage and the write column index. The same holds for the process of combining in the left-over addition unit 230.

The method of generating the target vectors for decimation filtering, i.e. vectors of the down-sampled input streams with different start offsets, includes performing a special store operation, which stores samples from a vector in a rotated manner in one or multiple columns of a memory, according to a pattern specific for decimation factor M, the write iteration, P, and the block level software pipeline stage. Thereafter, the desired down-sampled vectors are obtained by indexed reading of one element per column of this two dimensional memory, basically a logical row. The write and read patterns are chosen such that all elements of each desired target vectors are distributed over different columns, so that they can be read out in parallel in a single operation. For this method, in combination with the memory circuit 200, is that each input sample is only loaded once from an external memory (not shown).

The memory circuit 200 may support the creation of interpolation output vectors using a method similar to generating down sampled vectors. The main difference in the patterns is how data is stored. It does require P rotators, where for decimation only, 0.5P rotators are sufficient for M>L.

The memory circuit 200 may be designed to provide support for parallel load and store operations. This enables an implementation of block based decimation filtering for M<=0.5P, with software pipelined processing of sequential blocks: while reading out down-sampled vectors from the two dimensional memory directly used for filtering, the M input vectors needed for the next block/stage can be stored into it. The enabler of this pipelining is the method of control and therefore efficient filling of the memory (maximally MP cells are filled per stage, leaving room for (P−M)P samples of other stages).

Assuming a constant vector width, the memory circuit 200 may be implemented to support mode switching between different number of words per vector P. For example, with a vector size of 256 bits, it can be configured to support 8 words of 32 bit, 16 words of 16 bits or 32 words of 8 bits, etc. The number of rotators is $0.5P_{max}$ (here use for decimation-filtering only is assumed with M>1).

Figure 6A:
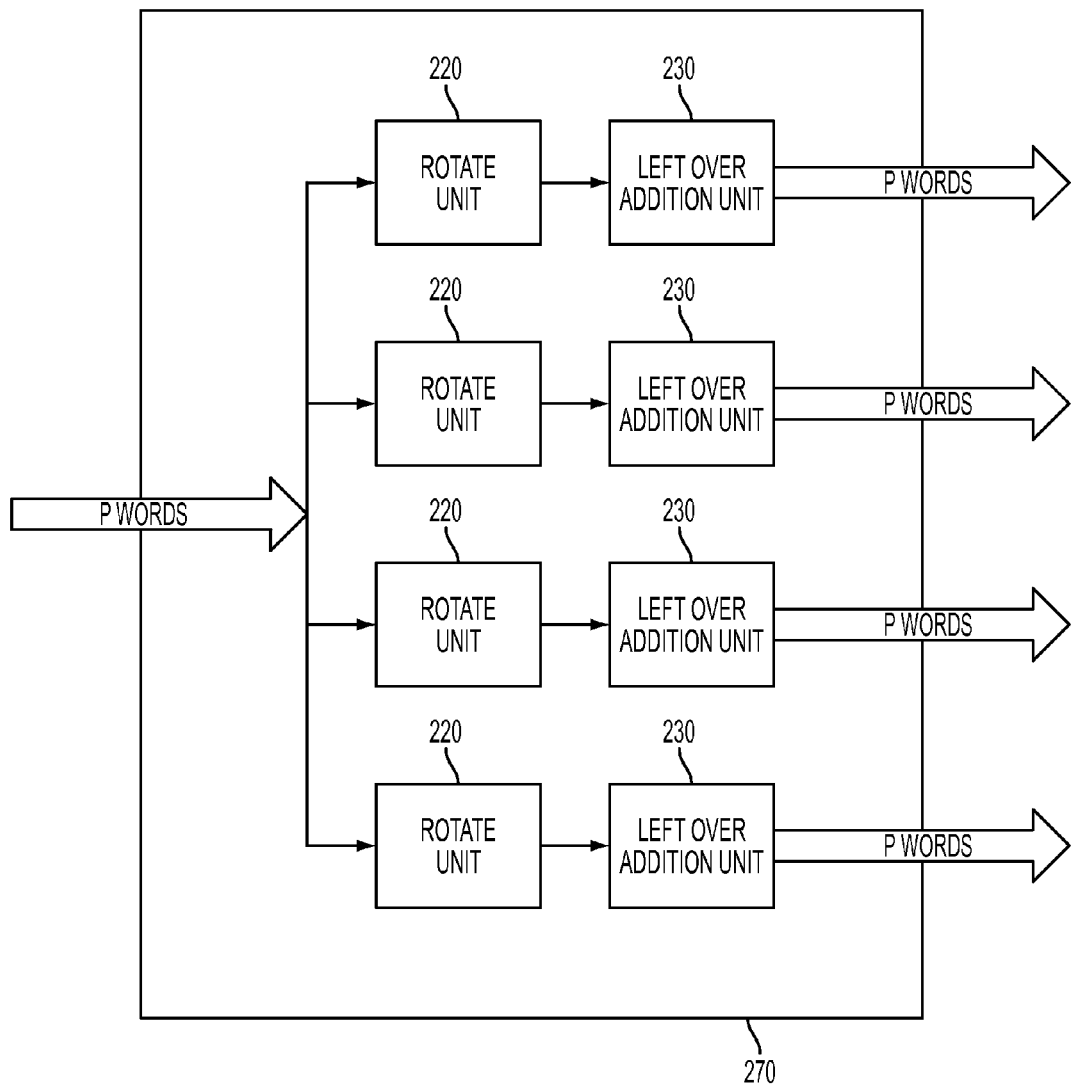
FIGS. 6A-6D are alternative exemplary embodiments of the rotate-and-distribute unit 270 shown in FIG. 5 of the present invention.
Figure 6B:
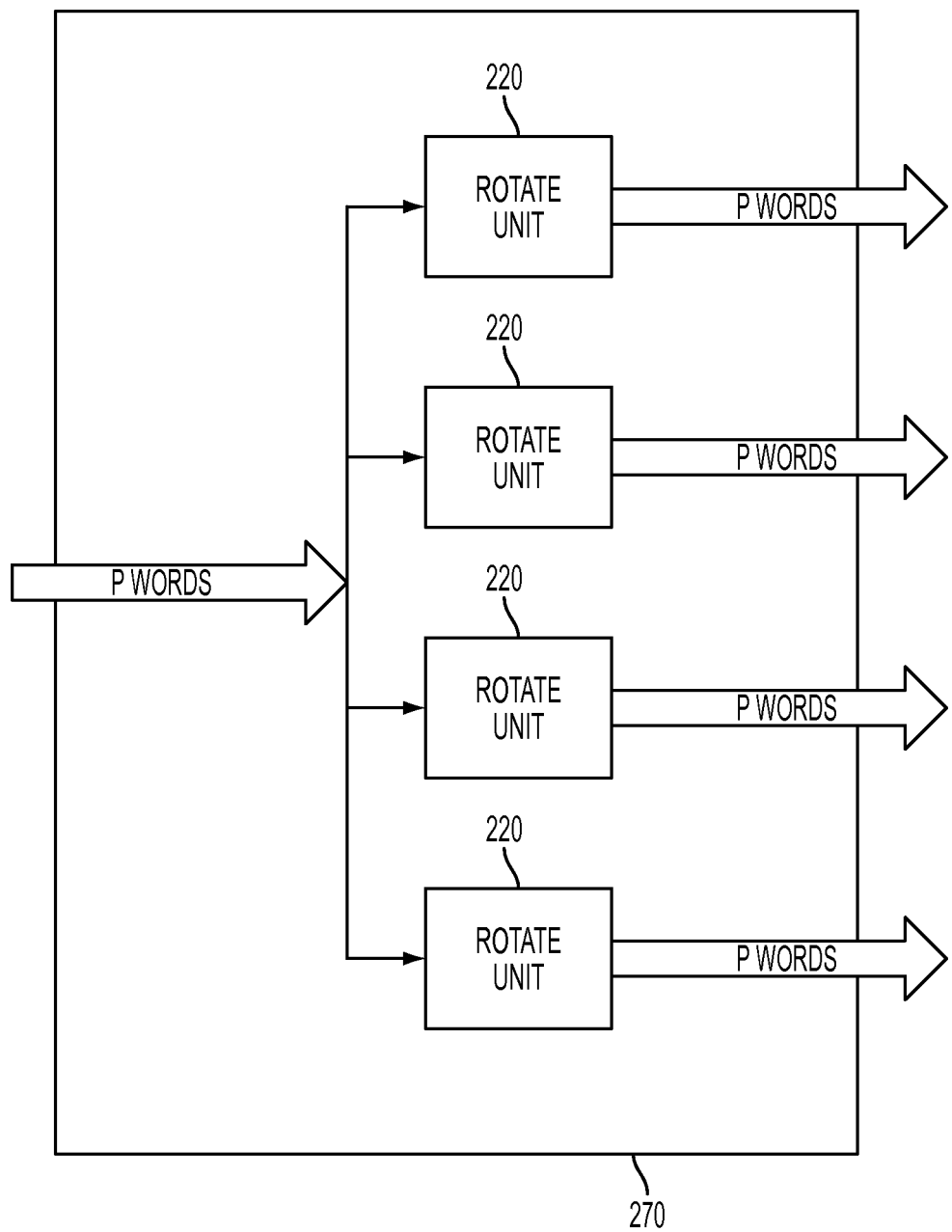

Referring to FIGS. 5 and 6A-6B, the memory circuit 200 of these exemplary embodiment is illustrated which accomplishes decimation. In this exemplary embodiment, only decimation filtering has to be supported with M>=2 having minimally 2 consecutive data elements. The store operation is done in a single cycle with data elements received from SIMD DSP 210, with a minimum of 0.5P rotate units 220, illustrated in FIGS. 6A and 6B, being needed since a maximum of 0.5P columns have to be filled using data elements from the same input vector.

Rotate units 220, shown in FIGS. 6A and 6B, rotate the input vector received from SIMD DSP 210, each with certain offset.

When block level software pipelining is required, the implementation may have for each row a write enable signal shared by all cells in the row generated by write controller 240. Only if both row and column enable signals are positive can a cell be written. The memory controller 200 does block based write enabling: M×roundup (P/M) write enabled cells. Write controller 240 generates write enables signals for the rows (M rows are write enabled depending on the software pipeline stage) and columns (max 0.5P columns will be written to in case of decimation M>=2).

Figure 6C:
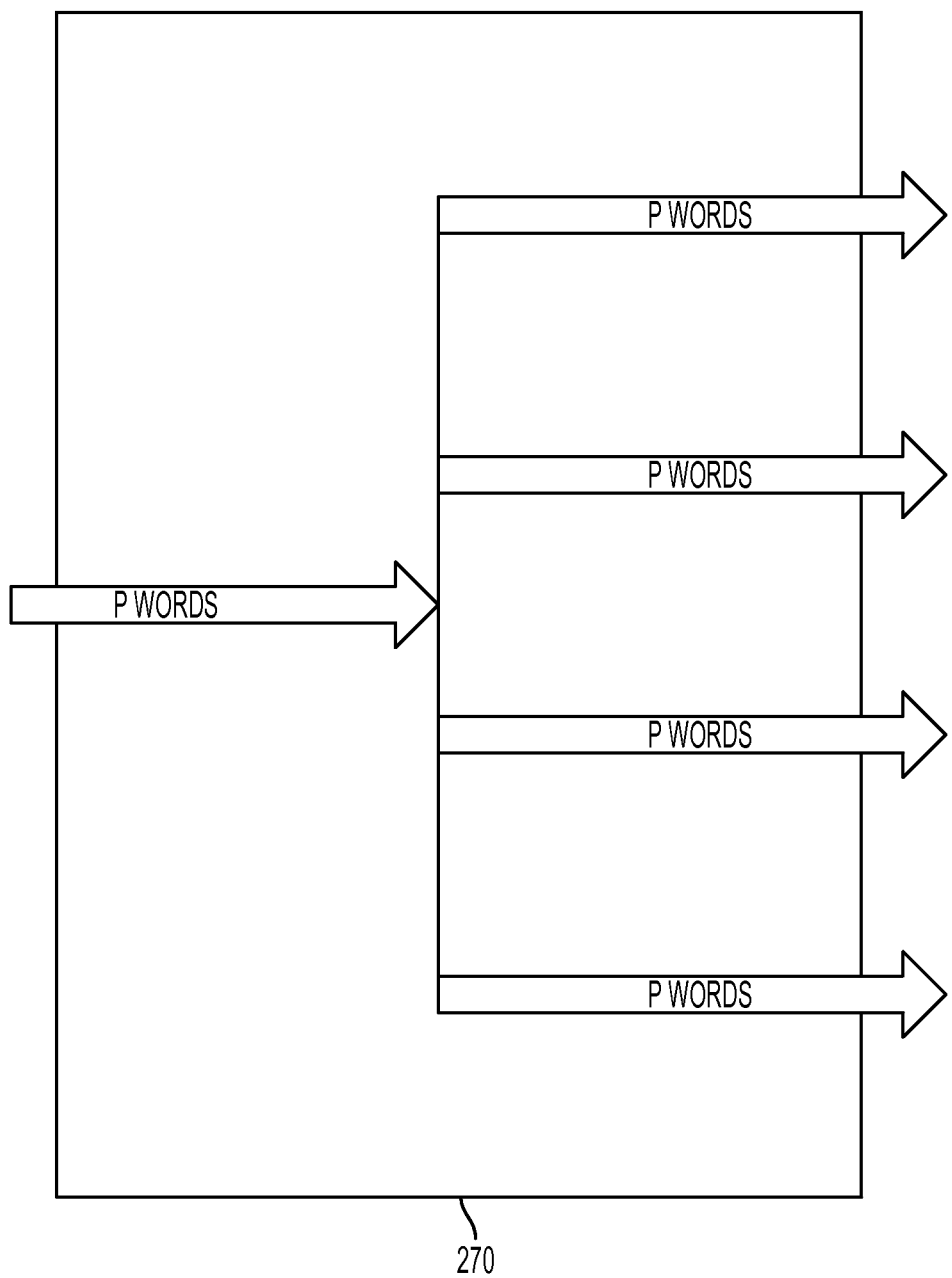
Figure 6D:
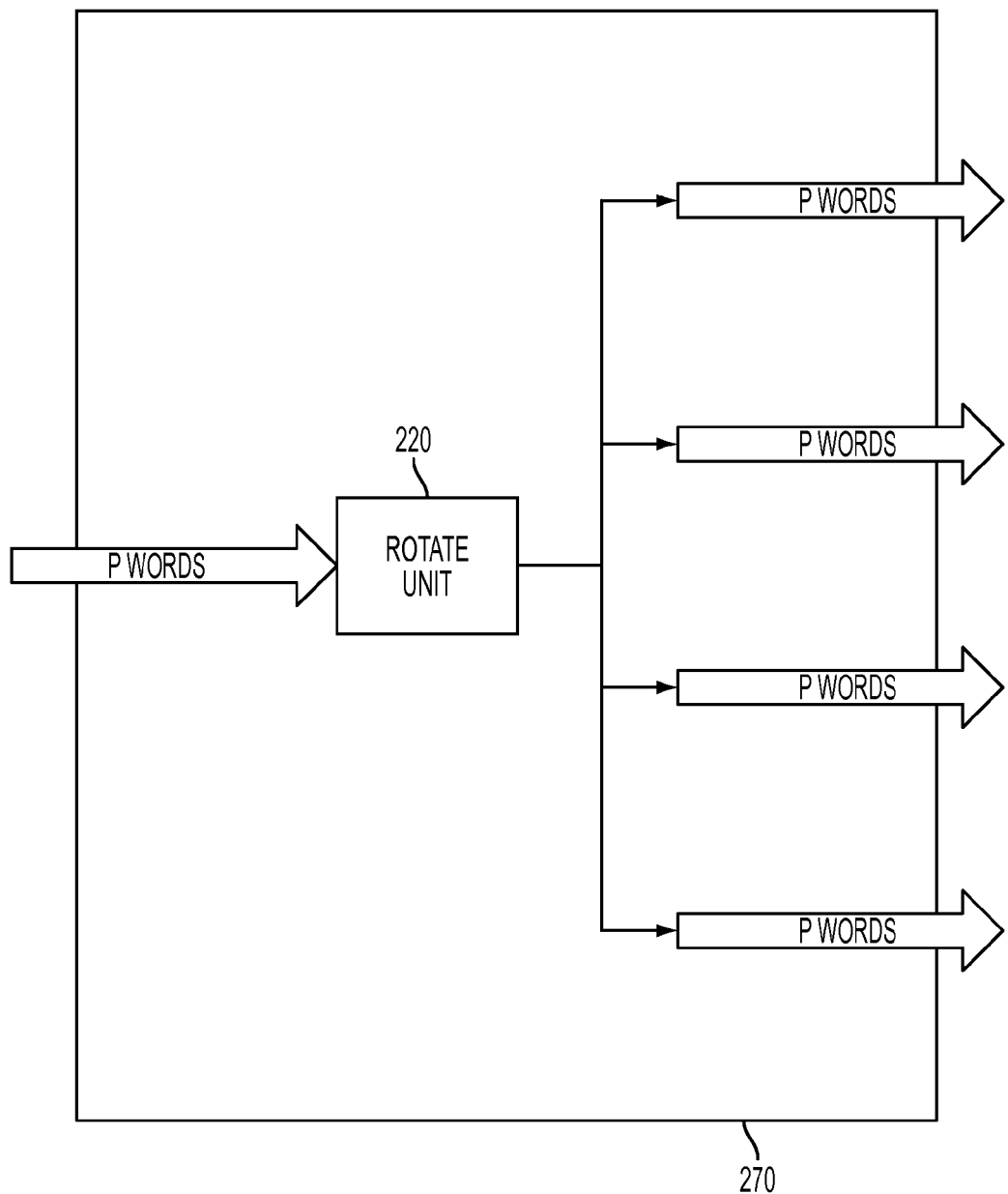

The left over addition units 230, shown in the embodiment illustrated in FIG. 6A, enable the preservation of samples from the previous store operation. The left over addition units 230 combine rotated vectors (received from rotate units 220) of current and previous input vector (stored internally in left over addition unit 230), such that relevant content of previous input vector is not discarded. However, the presence of the left over addition unit 230 is not required as shown in FIGS. 6B-6D. Therefore, normally left over addition is not required and data is usually passed directly to the two-dimensional register file 260 without further processing by the left over addition unit 230, as illustrated in FIG. 6B. This processing is further discussed in detail in reference FIGS. 7 and 8. The read controller 250 first selects per column one out of P cells per read port based on the row select signal. Read controller 250 indexes a logical=physical row in the two-dimensional register file 260 that is to be read out. The physical row index is based on the software pipeline stage and index of the decimated target vector. The two-dimensional register file 260 provides the indexed (row) vector to the EVP for further use or storage. Thereafter, a selector unit 265 selects P elements from P+E words and aligns them into the output vector. It should be noted that each output port of the two-dimensional register file 260 may have its own selector unit 265. The resulting data array is returned to SIMD DSP 210.

In this exemplary embodiment the vector width is 256 bits or P words. The memory circuit 200 may be configured for different values of P, i.e. different word widths W: 8 words of 32 bit, 16 words of 16 bits or 32 words of 8 bits. A smaller maximum for P, i.e. larger W, results in a less costly implementation: number of rotate units 220, columns, etc., scale based on the value of P.

Regarding the embodiments of the rotate and distribute unit 270 shown in FIG. 6C, the rotate and distribute unit 270 would simply transmit the vectors received SIMD DSP 210 to the two-dimensional register file 260 without further processing.

Further, as illustrated in FIG. 6D, rather than a number of rotate units 220 provided as in FIGS. 6A and 6B, as single rotate unit may be configured to accomplish the function of giving a common rotation related to the software pipeline stage as that previously discussed in reference to FIG. 6B.

Figure 7:
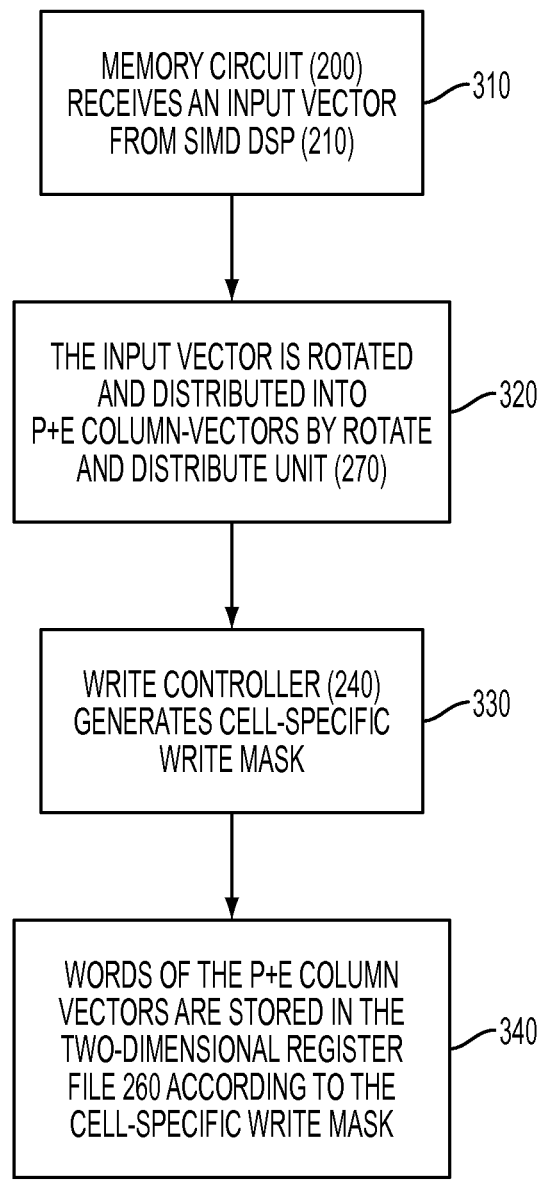
FIG. 7 is a flowchart illustrating the operating steps of the write function executed by the memory circuit 200 shown in FIG. 5 in an exemplary embodiment of the present invention.
Figure 9:
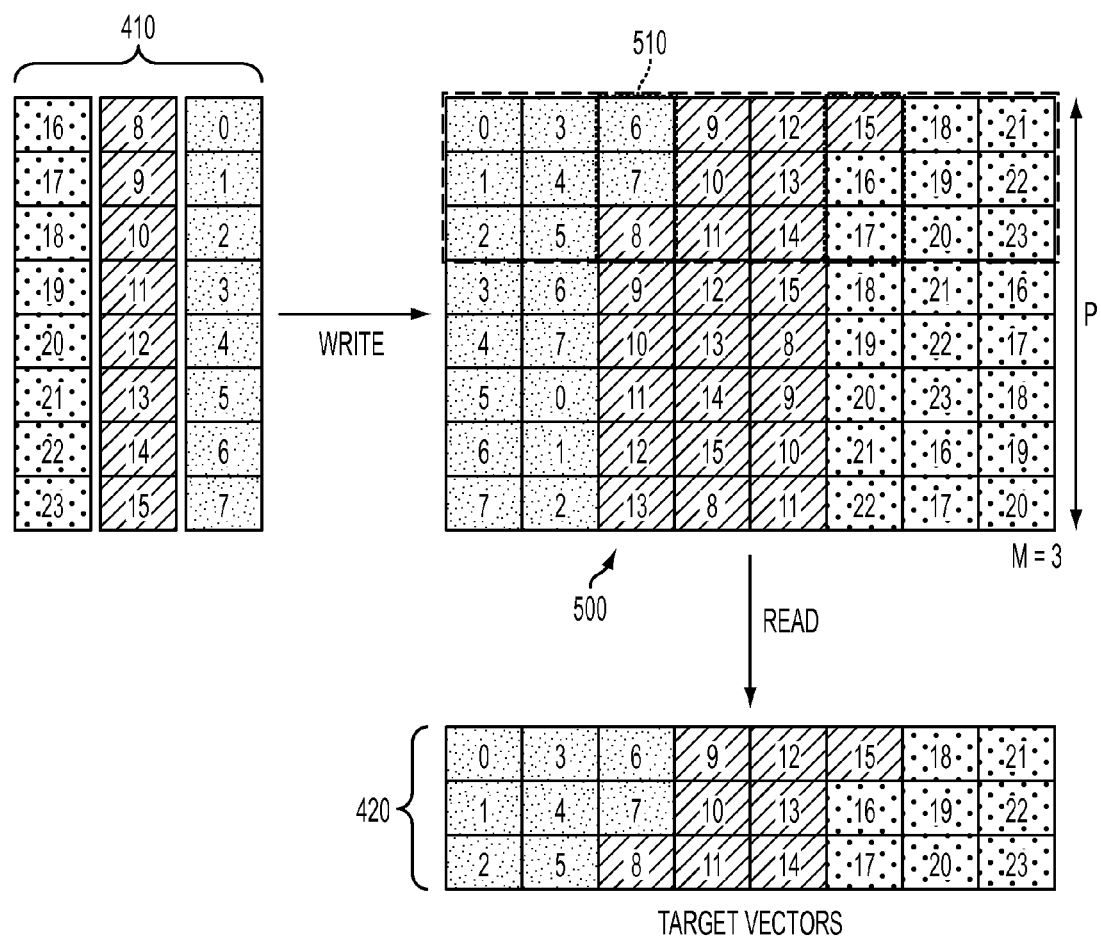
FIGS. 9-10 are exemplary data structures generated by the memory circuit 200 shown in FIG. 5 executing the steps of the flowchart shown FIGS. 7-8 in an exemplary embodiment of the present invention for the rotate-and-distribute circuit 270 according to FIGS. 6A-6B.

Referring to FIG. 7, an exemplary method of generating down-sampled target vectors for decimation filtering using the memory circuit 200 is detailed utilizing the rotate and distribute unit 270 shown in FIG. 5, as detailed in the embodiments shown in either FIG. 6A or 6B. In FIG. 7, in step 310, memory circuit 200 (of FIG. 5) receives an input vector from SIMD DSP 210 (of FIG. 5). The source vectors (columns) 410 are written to two-dimensional register file 260 as vector 500 having subgroups 510 and then read into the target vectors (rows) 420, illustrated in FIG. 9, are indicated for a use case with M=3, P=8, E=0. The target vectors 420 are identical to the content of the M rows of interest in the memory circuit 200 (the M rows belonging to a certain block level pipeline stage).

Further, as indicated in FIG. 9 is the data structure 500 contained within the two-dimensional register file 260 shown in FIG. 5. Data elements (subgroups 510) marked with white boxes are those that the method needs support to prevent overwriting of elements from the previous vectors. This may be done in the left over addition units 230, illustrated in FIG. 6A, for the rotation based implementation, by combining the rotated input vector 410 of the previous store operation with the rotated input vector of the current one.

However, in an alternative embodiment, cell-specific write enabling occurs per output of the rotate unit 220, so no longer is the write enable signal shared by all cells in a row. Thus the data of the previous vector is not overwritten.

For block level pipelining, all rotations may have a common offset, based on the pipeline stage. In this exemplary embodiment, the top M rows are filled, leaving P-M rows for other stages.

The reading out of target vectors 420 may be done by selecting a row in the two-dimensional register file 260.

Thereafter, in step 320, input vector 410 is rotated into P+E column-vectors by rotate and distribute unit 220. In step 320, it is further determined per column whether data from the prior input/source vector 410 exists.

The condition that rotated input vectors of write iterations w and w−1 have to be combined is given by:

```
start_column[w] == end_column[w−1]
where
    start_column[w] = floor(P*w/M)
    end_column[w−1] = ceil(P*(w−1)/M)
```

If data from such a prior input/source vector 410 exists, then the rotated vectors are in one possible implementation combined with the previous rotated input vector by left over addition units 230 as shown in FIG. 6A. If left over addition is not required then data is passed directly to the two-dimensional register file 260 without further processing by the left over addition unit 230.

The algorithm applied in the left over addition units 230 for combining the rotated input vector with the rotated input vector of the previous write operation is given by:

```
for j: 0..P−1
    combined_vector[j] = mask[j]*rotated_vector[w][j] +
        (mask[j])*rotated_vector[w−1][j]
end
```

The algorithm for the generation of this cell specific mask vector for column i, under condition that combining is required, is given by:

```
for j:0..P−1
    mask[j] = 0
    if(j > ((P−1) − ((M*i)%P))) mask[j] = 1
end
```

In the alternative embodiment of the rotate and distribute unit 270, requiring left over addition units 230 shown in FIG. 6A, the write controller 240 would generate row and column enable signals in step 330 from which cell-specific write-enable signals are derived by doing a logical AND operation on the row and column signals specific to the cell. Entire blocks of the two dimensional register file are written. As explained, the content of the previously received input vector is preserved by the left-over-addition units.

In the alternative embodiment of the rotate and distribute unit 270, not requiring left over addition units 230 shown in FIG. 6B, the write controller 240 would generate cell-specific write-enable masks in step 330 to be applied by the two-dimensional register file 260. Cells containing elements from the previous input vector will not be write-enabled, therefore they are not overwritten.

Figure 10:
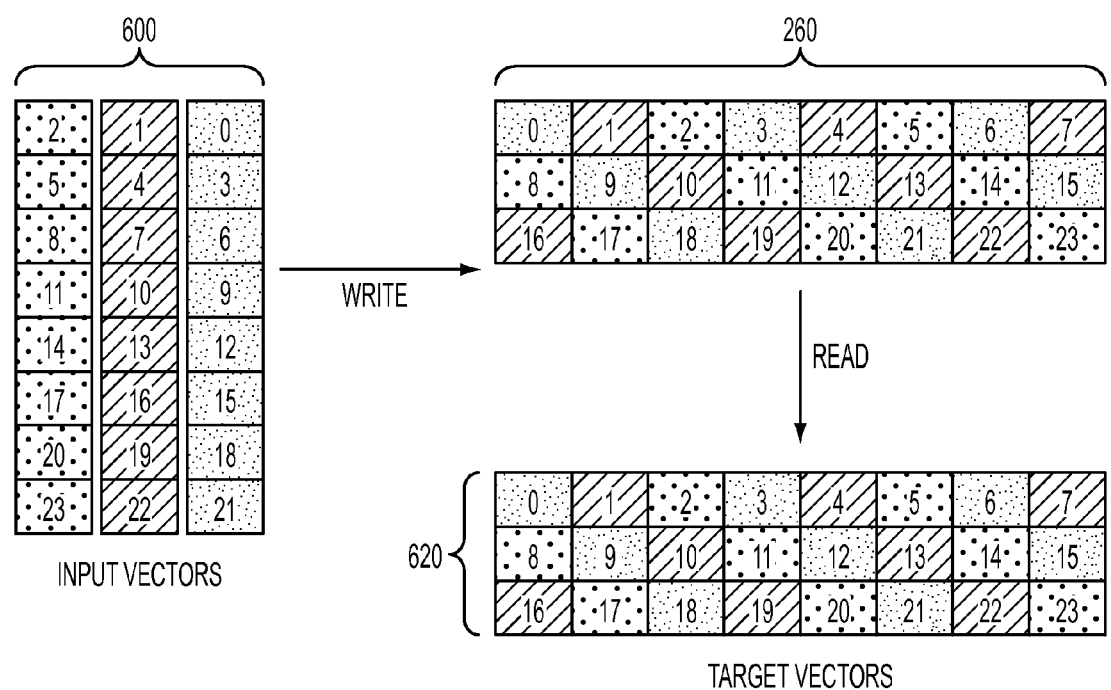
Figure 11:
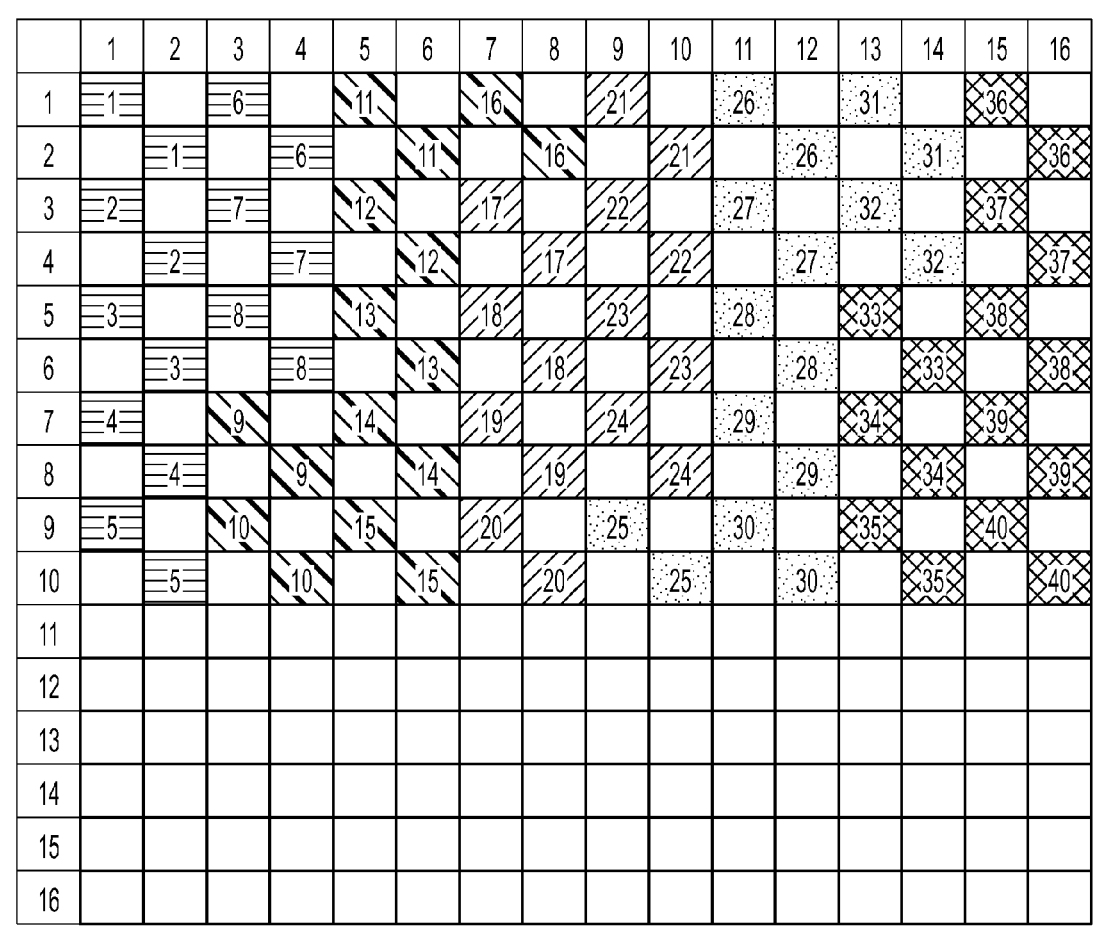

Thereafter, in step 340 words of the P+E column vectors are stored in the two-dimensional register file 260 according the cell specific mask created in step 330. The spreading process is executed at step 340 in which rotated and optionally combined vectors are stored in columns of the two-dimensional register file 260. The different shading/hashing used in FIGS. 9-11 are used to indicate the source vector of a data element.

As illustrated in FIG. 9, in step 320, the filling of M rows in the memory by rotating the M input vectors (as E=0) in a target column specific distance. Groups of (maximally) M consecutive elements from input vector are stored in different columns in one cycle. The rotation per group of elements is target column specific.

Regarding FIG. 9, the operation of left-over addition 230 is illustrated in which the input vector of the first write iteration (0, 1, . . . 7) is received by the rotator belonging to the third column. It is rotated with an offset corresponding to the third column, M=3 and the first write iteration: (6,7,0,1,2,3,4,5). Assuming row specific write enabling, only the elements of in the first 3 rows are written in this column: (6,7,0). The left over addition unit 230 stores the rotated input vector internally. The second input vector (8,9,10,11, 12,13,14,15) is received by the rotator belonging to the third column. It receives a rotation corresponding to the third column, M=3 and second write operation: (14,15,8,9,10,11, 12,13). The rotated versions of current and previous input vector are combined such that relevant data of the previous input vector is not overwritten: (6,7,8,X,X,X,X,X). Elements of this resulting vector 510 are stored into the third column of the two-dimensional register file 260, in the first M=3 write enabled rows, (6,7,8).

The mapping of input data elements of M input vectors into the two-dimensional register file 260 with E configured as 0, giving the column mapping function and (row) address function used during writing, is given by:

```
for i: 0..M−1
    for j: 0..P−1
        row_index = ((i*P+j)%M + offset[s])%P
        column_index = floor((i*P+j)/M)
        register_file[row_index][column_index] =
            input_vector[s][i][j]
    end
end
```

With regards to decimation filtering, the M rows containing the target vectors belonging to the software pipeline iteration of interest, relate to the input vectors similar as the algorithm that was explained in the background related to FIG. 3. In addition, there can be an offset applied to map the M target vectors in a free range of rows, for example depending on the software pipeline stage "s".

```
for i: 0..M−1
    for j: 0..P−1
        row_index = (i + offset[s])%P
        register_file[row_index][j] = target_vector[s][i][j]
    end
end
```

Paired with a rotate-and-distribute unit 270 of FIGS. 5 and 6A, the write controller circuit 240 does simple block based write mask enabling (i.e. enable writing in R rows×C columns), as the rotate-and-distribute unit does combining and merging with the rotated vector of previous operation (in left-over addition units), which is required to keep its useful elements.

Figure 8:
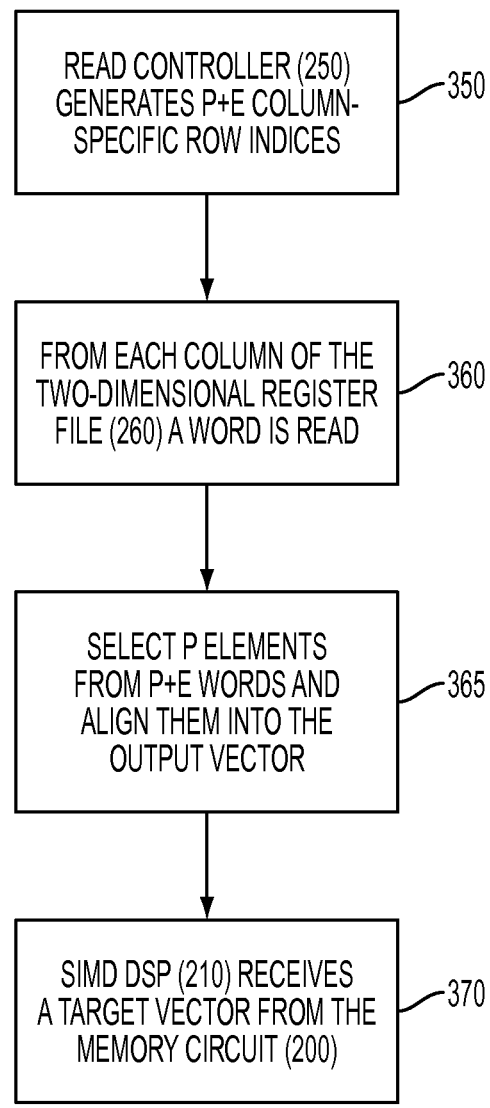
FIG. 8 is a flowchart illustrating the operating steps of the read function executed by the memory circuit 200 shown in FIG. 5 in an exemplary embodiment of the present invention.

Referring to FIG. 8, the read function of the read controller 250 will be discussed in detail. In step 350, the read controller 250 generates P+E column-specific row indices. Thereafter, in step 360, from each column of the two-dimensional register file 260 a word is read. Further, the selector unit 265 selects P elements from P+E column outputs in step 365 and aligns them in the correct position of the output vector. Finally, a SIMD DSP 210 receives a target vector from the memory circuit 200 in step 370.

The method of generating target vector for interpolation will now be discussed in reference to FIGS. 7, 8 and 10. Input vectors 600 are used to generate L target vectors 620 in target table 610. Each of these L input vectors 600 is a down-sampled version of the desired output signal with a different start offset. Using the memory circuit 200, these L input vectors 600 may be interleaved, i.e. L reordered target vectors 620 of the output signal are generated. The elements of each input vector 600 are rotated according to the target vector row and written in the appropriate columns with distance L apart. After storing L input vectors 600, L target vectors 620 may be read. It should be noted that the write patterns are such that from each column one element is read during read step 360.

If interpolation has to be supported, in addition to decimation, P columns are written into during the store operation, implying that P rotate units 220 are required.

To support interpolation, in addition to decimation, a rotate-and-distribute unit, for example according to FIG. 6B with P rotators, in combination with cell specific write control is required. Therefore, FIG. 10 illustrates input vectors 600 for the memory circuit 200, which are down-sampled versions of the desired interpolation output signal each with different start offset. The data elements of each input vector 600 are rotated according to the target vector row and written in the appropriate columns 620 with distance L apart as target vectors 610. After storing L input vectors 600, L reordered target vectors 610 can be read out to the SIMD DSP 210.

The mapping into the register file (with E=0) from the input vector perspective (column mapping function, row/cell addressing function) is given by the following algorithm (where i represents the input vector index and j represents the element index):

```
for i: 0..L−1
    for j: 0..P−1
        row_index = floor((j*L+i)/P)
        column_index = (j*L+i)%P
        register_file[row_index][column_index] = input_vector[i][j]
    end
end
```

FIG. 11 illustrates the variable word width feature of the exemplary embodiment shown in FIGS. 3-7. FIG. 8 illustrates a physical register file 800 that can store 16×16 physical elements (N.B. E=0) of a certain width, say $W_{min}$. In this example, the number of logical words per vector is 8, where the word size W is $2*W_{min}$. The register file 800 is conceptually split into 8×8 squares that can hold one logical word. FIG. 11, illustrates the mapping for the decimation case with M=5 (N.B mapping specific to embodiment 1). The two elements that form a logical word are mapped diagonally into the square allocated to the logical word.

There are four significant benefits generated through the use of the exemplary embodiment shown in FIGS. 5-11. First, flexible implementations of decimation filtering, interpolation, matrix transposition and similar algorithms on a processor elements 100 (i.e., vector DSP) are enabled. Second, using circuit memory 200, down-sampled target vectors for decimation filtering can be efficiently generated in which only M unique input vectors are loaded for generating M target vectors. Similar output vectors for interpolation, matrix transposition and similar algorithms are also efficiently generated. Essential to this method is that each input sample is only loaded once per block from another external memory (not shown). Third, with the support for parallel load and stores provided by memory circuit 200, block level software pipelining is enabled for both decimation and interpolation. Fourth, memory circuit 200 supports switching between a different number of elements P, with a certain $P_{max}$ for both decimation and interpolation.

The memory circuit 200 according to other exemplary embodiments of the rotate-and-distribute and controller units shown in FIG. 6C-6D will now be discussed in detail. The write controller 240 provides (in the general case) write-enable signals for P elements per column based on a pattern. The pattern can be either generated based on a user provided configuration and/or internal state specifying decimation factor M, P, the block-level pipelining stage and write iteration number (see Goossens for additional information). Alternatively, the pattern may be provided as an index/offset vector, i.e. for each source element, the target location/displacement in its row is specified. When only decimation is required and a pattern generator is used, the write controller only has to provide 0.5P write mask signals, each for P cells, (N.B. because of M=>2, the mask generators can be shared by two or more columns) and P+E column enable signals. To support interpolation, P write mask signals are needed (or P+E masks if there is no sharing). In this embodiment (FIG. 6D), for the write phase an input vector rotator 220 is used to support block level software pipelining.

Unlike the exemplary embodiments related to FIGS. 6A-6B, no rotate units 220 are required in the rotate-and-distribute unit 270 of this exemplary embodiment shown in FIGS. 12-15. With the elimination of the rotate units 220 a further cost savings may be realized in the exemplary embodiment.

In the exemplary embodiment shown in FIG. 9, as illustrated in FIG. 5, the vector width is 256 bits or P words. The memory circuit 200 may be configured for different values of P, i.e. different word widths W: 8 words of 32 bit, 16 words of 16 bits or 32 words of 8 bits. A smaller maximum for P, i.e. larger W, results in a less costly implementation of the present invention, as the number of columns, etc. change in scale according to the value of P.

An input vector rotator 220 (when software pipelining is needed) receives the input vector from the SIMD DSP 210. It rotates the input sample vector and writes the rotated vector to all columns of the two-dimensional register file 260. The column cells where the data is actually written depends on the write masks and column enable signals.

Figure 13:
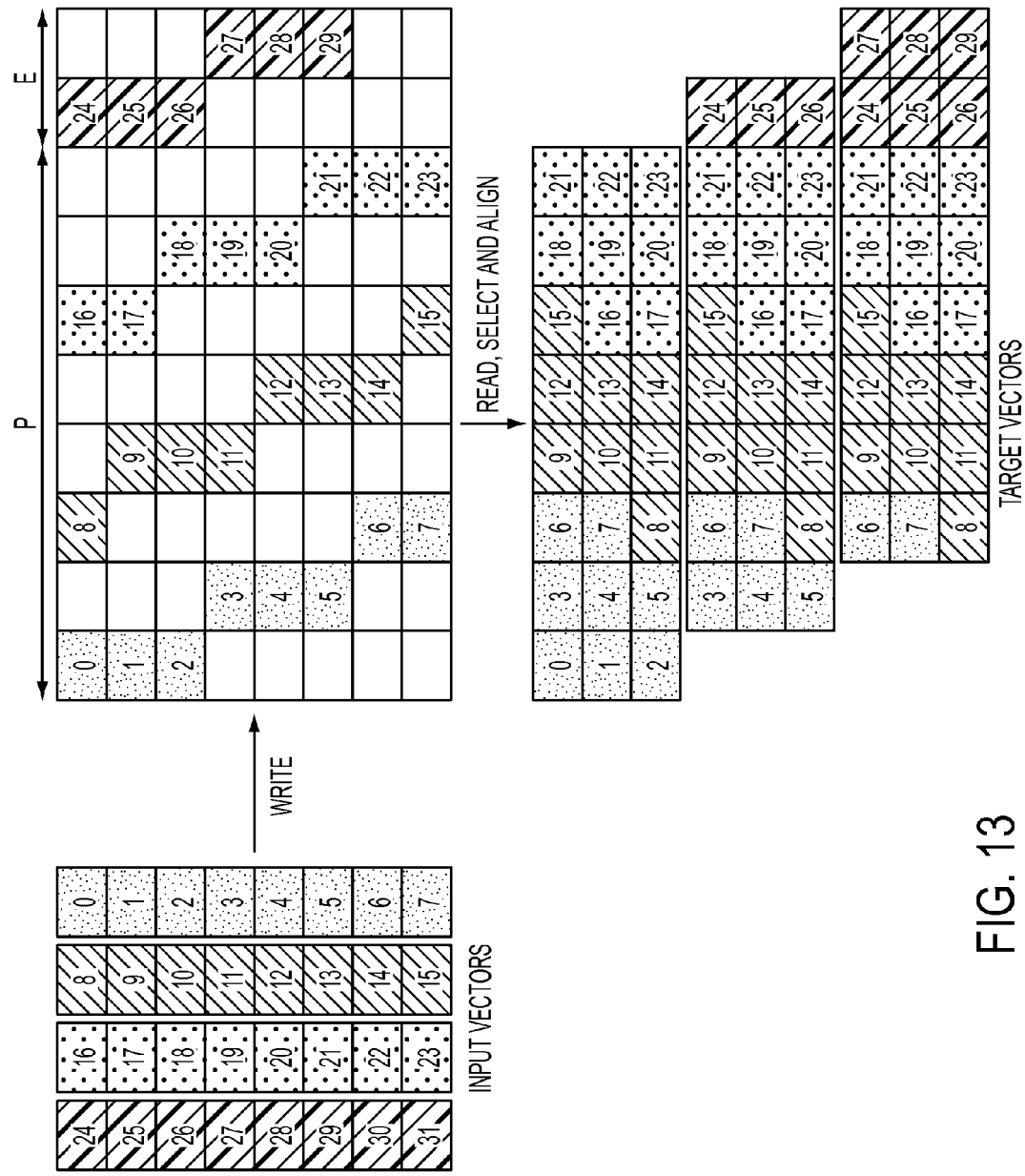
FIG. 13 illustrates the mapping for symmetric decimation filtering belonging to the rotate-and-distribute circuit 270 according to 6C.

An example of the rotation for software pipelining is provided for stage 1 the first M elements are written (column-wise) starting from the top-left element of FIG. 13. The second set of M elements is written in the second column starting in row M. The next stage starts to be written in the M+1th element of the first row, i.e. a rotation of the input vector of M. In the second row the second set of M elements of the second vector gets a rotation of 2M (with wrap around of the data elements in the vector) before it is written. This vertical rotation/displacement is applied to all elements of this stage. Alternative to rotating the input to enable software pipelining, this support may also be implemented with rotators in the read port.

The write controller 240 generates per column, per element a write enable mask. These masks support writing with a certain distributed access pattern based on M, P, the software pipeline stage, the column index and the write iteration. For decimation, masks can be shared between two (or multiple if E>0) columns. Then there are additional column enable signals (equal to the number of columns) that enable one of the columns that share a mask.

The read controller 250 generates per read port per column a cell index, i.e. physical row index, which is based on the target vector index and software pipeline stage. This element is returned by the read circuit of the two-dimensional register file 260. From P+E columns P elements are selected and aligned in the output vector. The combined P elements are provided/output to the EVP.

The method of generating down-sampled target vectors using the memory circuit 200 of the exemplary embodiment shown in FIG. 5, with rotate-and-distribute units according to FIG. 6C or 6D, will now be discussed in detail with reference to FIGS. 3, 4 and 12-14.

FIGS. 7 and 8 illustrate the flowchart detailing the operation of the memory 200 shown in FIG. 5. At the outset, memory circuit 200 receives input vector from SIMD DSP 210 in step 310. Thereafter, in step 320 the input vector is rotated by the sample rotator 230 of the rotate-and-distribute unit (a circuit prepared for software pipelining is considered in this case, see FIG. 6D). In step 330, cell specific write enable signals are generated by the write controller. In step 340, elements of each rotated vector are stored in the two-dimensional register file 260 stored in a cell having the same row index as the input element, with a maximum of M consecutive elements per column.

Figure 12:
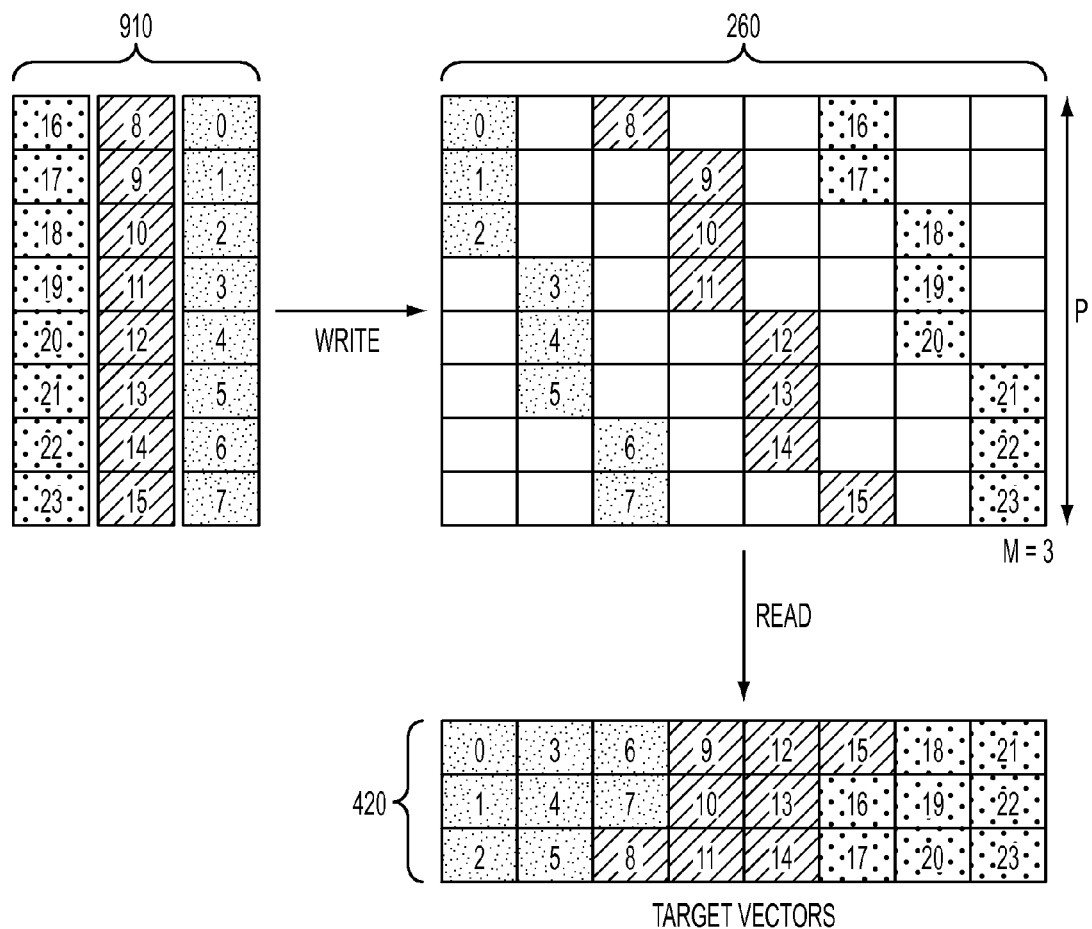
FIG. 12 is an exemplary data structure generated by the memory circuit 200 shown in FIG. 5, executing the steps of the flowchart shown in FIGS. 6 and 7, in an exemplary embodiment of the present invention for the rotate-and-distribute circuit 270 according to FIG. 6C-6D.

FIG. 12 illustrates the source vectors (columns) 410 and target vectors 420 used in an example case with M=3, P=8, E=0. The target vectors 420 are stored into the two-dimensional register file 260 according to a certain pattern based on the decimation factor M, the write iteration, and the software pipeline stage. In Goossens, a mathematical description of the aforementioned patterns may be found. The write controller 240 provides cell-specific write enable signals according to the desired write pattern. It should be noted that in this exemplary embodiment, the source vectors 410 do not need a different rotation per-column of the two-dimensional register file as in previous embodiments. In FIG. 12, an example pattern is shown for M=3.

The mapping/writing into the register file from the input vector perspective (column mapping function, row/cell addressing function) is given by the following algorithm. Here i represents the input vector index (up to M as E=0), j the element index.

```
for i: 0..M-1
    for j: 0..P-1
        row_index = j
        column_index = floor((i*P+j)/M)
        register_file[row_index][column_index] = input_vector[i][j]
    end
end
```

To extract the target vectors 420, a pattern with one cell index per column is used, which is based on the desired virtual/logical row vector. In FIG. 11, data elements in bold text (0, 3, 6, 9, 12, 15, 18 and 21) are the data elements belonging to the first target vector 420.

The read control for reading out of target vectors from the two-dimensional register file (with E=0) is given by the following algorithm,

```
for i: 0..M-1
    for j: 0..P-1
        row_index = (j*M+i)%P
        column_index = j
        target_vector[i][j] = register_file[row_index][column_index]
    end
end
```

Referring to FIGS. 6C and 13, generating target vectors for symmetric decimation filtering may be accomplished as described below. The memory circuit 200 and control supports writing into P+E columns, with E>0. There are one or two read ports, as illustrated in FIG. 5, that may select P elements out of the P+E columns from the input vectors 600 and do simple shift for alignment. Referring to FIG. 13, the method of generating M(1+E) target vectors 620 using the two-dimensional register file 260 with E additional columns is filled column-wise in ceil(M+M*E/P) steps, with input vectors, whose relative offset is P samples. The content of two dimensional register file then contains M(1+E) unique target vectors 620 of length P. Reading out a vector of P samples is based on for example the desired target vector index given M, P and E.

In FIG. 13, target vectors 620 are stored in the two-dimensional register file 260 by the rotate and distribute unit 270 shown in FIG. 6C. Each block of M target vectors are the time-shifted versions (time step equals M) of the downsampled sequences of the first block of M target vectors, having each 1 new element in the last column. So each additional element in the extra columns adds another target vector. Per column there are M extra elements. The number of target vectors is therefore the original M base vectors+ M*E extra target vectors.

Using this memory, downsampled target vectors for decimation filtering and especially symmetric decimation filtering can be efficiently generated. Ceil(M+M*E/P) input vectors are stored into this memory and allow the generation of M(1+E) downsampled vectors. With a basic 2D memory, P vectors are stored to generate maximally P downsampled vectors. With the invented memory circuits having rotate-and-distributed circuits according to FIGS. 6A-D and multi-column distribution of input samples, M vectors are stored to generate maximally M downsampled vectors. With this invention applied in the discussed exemplary embodiment with simple selectors in the read ports, the overhead of making M base vectors is identical to the unextended memory circuits, but the overhead and resource utilization of making the following M*E vectors can be reduced, by doing another ceil(M*E/P) stores into the two-dimensional register file 260.

Symmetric filtering for this embodiment can be supported efficiently up to K=M(1+E). Exploiting symmetries means the calculation of two filter coefficients per multiply-accumulation operation.

With two read ports (illustrated in FIG. 5) an efficient schedule for decimation filtering on a VLIW vector DSP (with support for parallel addition and multiply-accumulate operations) is enabled. This means in the key loop of the decimation filter (maximally) one multiply-accumulation operation per cycle, i.e. maximally 2 filter coefficients per cycle.

The processing involved in the symmetric decimation filtering, for an exemplary embodiment with simple selectors in the read ports, as illustrated in FIG. 13 will be described by the writing and reading algorithms. The mapping/writing into the register file from the input vector perspective (column mapping function, row/cell addressing function) is given by the following algorithm. Here i represents the input vector index, j the element index. Note that the algorithm is identical to the earlier one for E=0, except that the iteration bound is not M-1 but ceil(M+M*E/P)-1, as additional input vectors can be stored in the extra columns.

```
for i: 0.. ceil(M+M*E/P)-1
    for j: 0..P-1
        row_index = j
        column_index = floor((i*P+j)/M)
        register_file[row_index][column_index] = input_vector[i][j]
    end
end
```

The read control for reading out of M(1+E) target vectors from the two-dimensional register file with E>0 and simple selectors in the read ports is given by the following algorithm,

```
for i: 0..M(1+E)-1
    for j: 0..P-1
        row_index = (j*M+i)%P
        column_index = j + floor(i/M)
        target_vector[i][j] = register_file[row_index][column_index]
    end
end
```

The difference in the algorithm for E>0 relative to E=0 that more target vectors can be read, changing the loop iteration bound to M(1+E)-1. Further the column index, increments by one for every next set of M target vectors.

An exemplary method of supporting block level software pipeline stages with this memory circuit 200 the data structure shown in FIG. 14 will now be discussed. In this aspect of this exemplary embodiment, to enable block level software pipelining, a (shared) single rotate unit 220 (according to the embodiment illustrated in FIG. 6D) gives a rotation to align the target vectors of this block to M unused virtual rows. Alternatively, it is possible to store another block level pipeline stage with an offset in the column direction, instead of giving a rotation in the row direction, so no input vector rotation is required. However, this alternate approach does require selection (with rotation) support in the read port (not shown).

Figure 14:
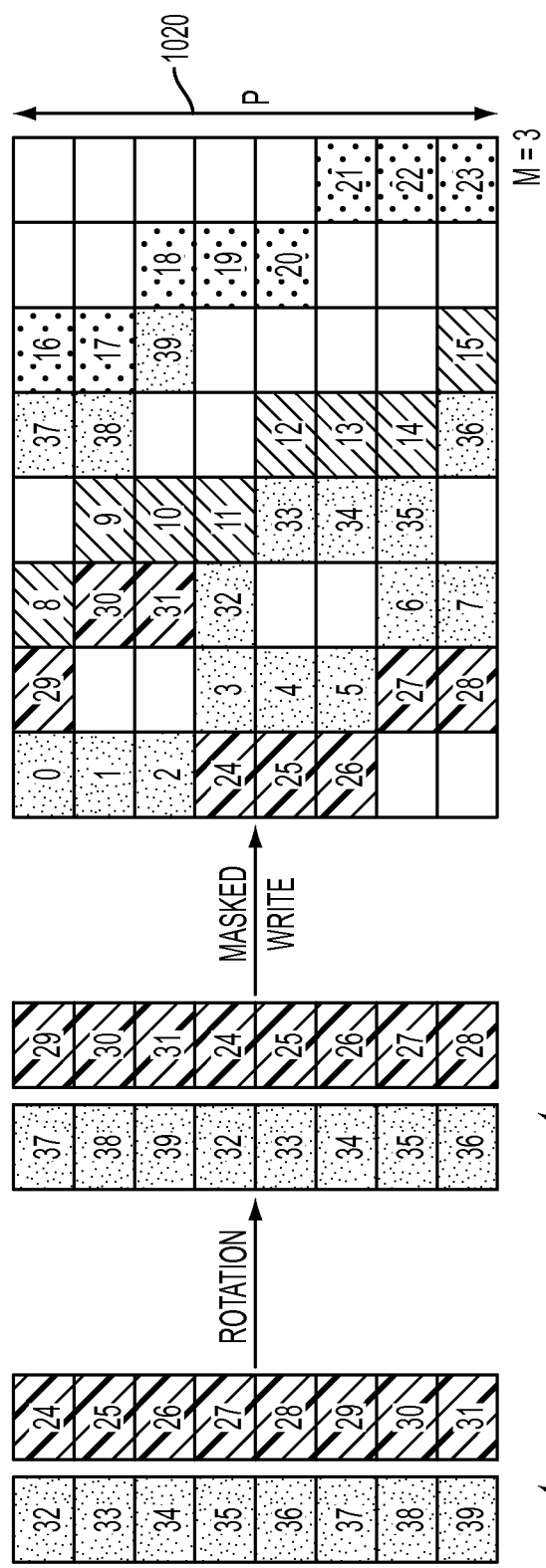
FIG. 14 illustrates the mapping for different software pipeline stages belonging to the rotate-and-distribute circuit 270 according to 6D.

Therefore, FIG. 14 illustrates two input source vectors 1010 for the next block (P=8, E=0). Pre-rotation of the input source vectors is done by rotate unit 220 of the rotate-and-distribute unit to give an offset of target vectors 1020 of M rows. Thus, filling of an array in the two-dimensional register file 260 according to pattern specific for M, using write iteration and block level software pipeline stage.

FIG. 14 extends FIG. 12 for support of block-level software pipelining. A software pipeline iteration specific rotation is applied to the logical row index to get the physical row index for reading, as follows (for E=0):

row_index=(j*M+i+offset[s])%P where offset[s] for example equals offset[s]=s*M.

Figure 15:
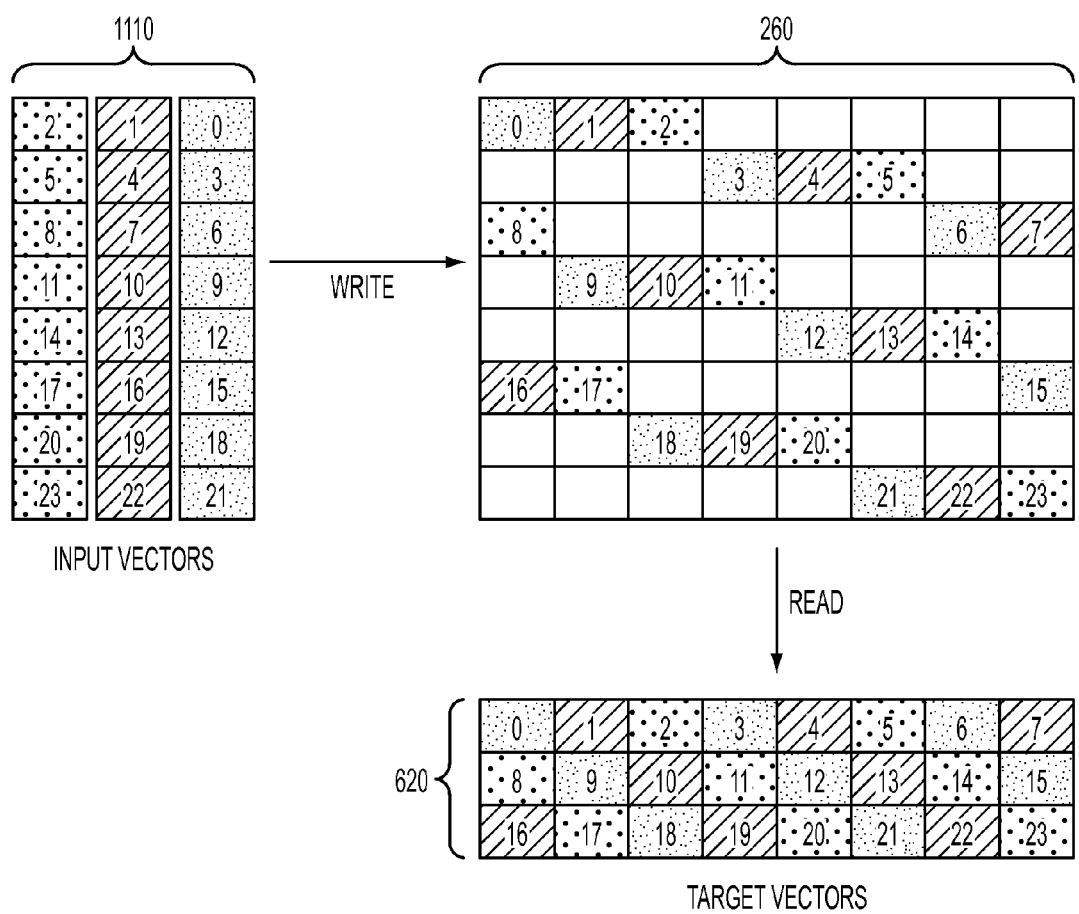
FIG. 15 is an exemplary data structure generated by the memory circuit 200 shown in FIG. 5 executing the steps of the flowchart shown FIGS. 6 and 7 in an exemplary embodiment of the present invention for the rotate-and-distribute circuit 270 according to FIG. 6C-6D.

Referring to FIG. 15, the method of interleaving vectors for interpolation is an extension of the previously discussed method of generating down sampled vectors for decimation filtering, previously discussed.

In FIG. 15, input vectors for the memory circuit, which are down-sampled versions of the desired interpolation output signal each with different start offset are illustrated. The data elements of each input vector 600 are written in a strided manner into the appropriate columns with a distance L apart and stored in two-dimensional register file 260 (configured as E=0). After storing L input vectors 600, L reordered target vectors 620 may be read out.

The algorithm for storing into the two-dimensional register file 260 (column mapping function, row/cell addressing function), as seen from the input vector perspective is as follows:

```
for i: 0..L-1
    for j: 0..P-1
        row_index = j
        column_index = (j*L+i)%P
        register_file[row_index][column_index] = input_vector[i][j]
    end
end
```

The algorithm for reading target vectors from the two-dimensional register file 260 (configured as E=0) is as follows:

```
for i: 0..L-1
    for j: 0..P-1
        row_index = floor((i*P+j)/L)
        column_index = j
        target_vector[i][j] = register_file[row_index][column_index]
    end
end
```

Figure 16:
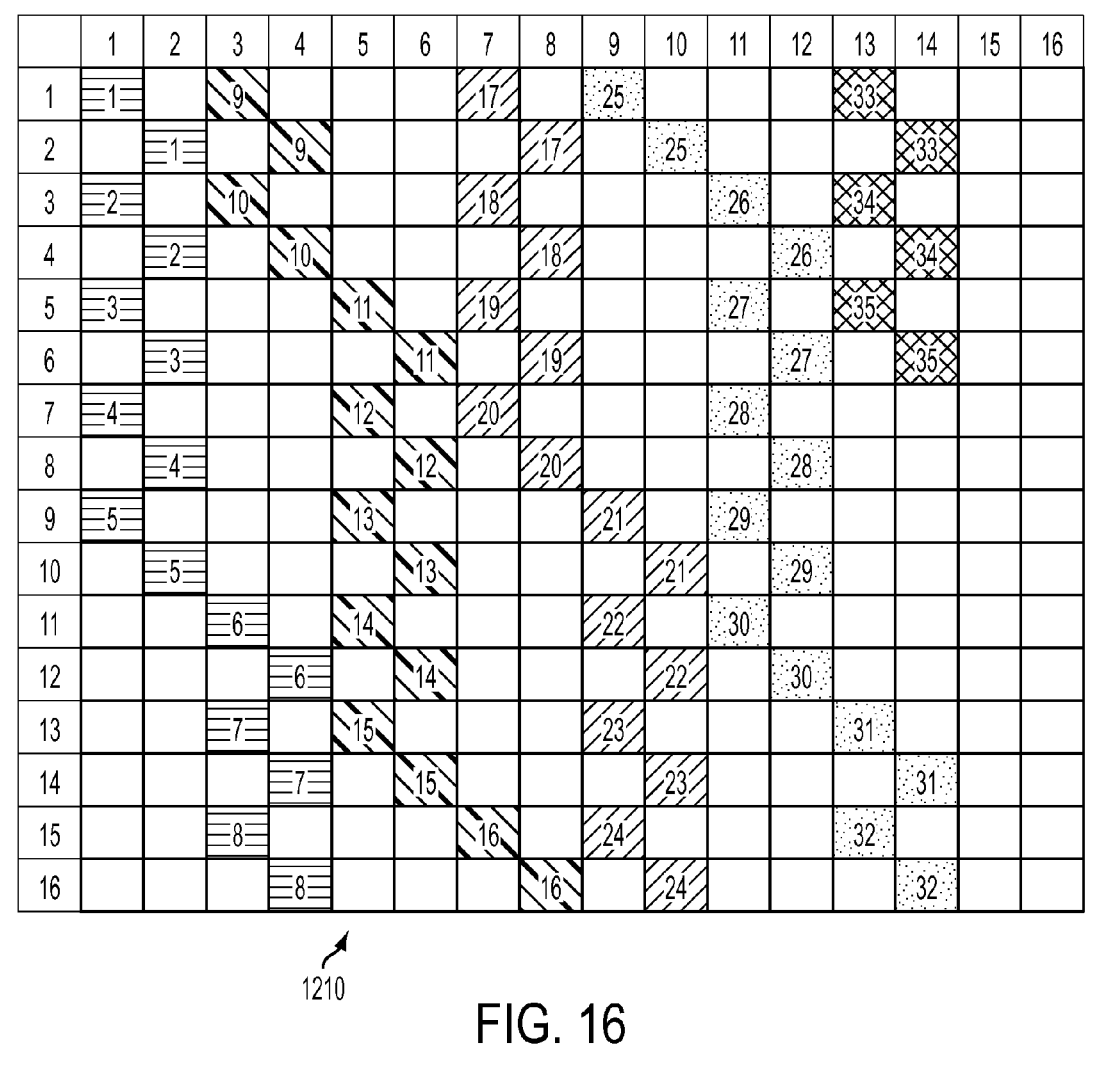

Referring to FIG. 16, the data structure shown illustrates switching between number of elements P per vector, i.e. switching between element word width W. For a chosen $P_{max}$ (or $W_{min}$), the $W_{min}$ is considered as the granularity to store the data elements for any P ($2nP=P_{max}$). Words of size W are divided in sub-elements of size $W_{min}$ and stored in a diagonal manner. It is noted that the memory circuit 200 is designed so that all sub-elements that have to be read out into the same target vector 1210 are stored in different columns. Further, the relative offset between the sub-elements in the column direction is not changed during the write operation. In FIG. 16, M=5, E=0, $P_{max}$=16, and P=8.

FIG. 15 discusses the support of a variable number of words P in a vector, with a certain maximum $P_{max}$, where $nP=P_{max}$ and n is even. So a logical vector of P elements can be partitioned into P sets of n sub-elements. The mapping algorithms as discussed in relation to FIG. 15 apply to logical vectors of length P into a logical two-dimensional array of P×P. The mapping of each cell element (having n sub-elements) of the logical array on the physical array of $P_{max} \times P_{max}$ is given as follows:

```
for i: 0..P-1              //logical row index
    for j: 0..P-1          //logical column index
        for e: 0..n        //subelement index
            physical_register_file[i*n+e][j*n+e] =
                logical_register_file[i][j][e]
        end
    end
end
```

The benefits provided by the embodiment of the present invention with a rotate-and-distribute unit according to FIG. 6C or 6D with mappings shown in FIGS. 12-15 include those provided by the exemplary embodiment with a rotate-and-distribute unit according to FIG. 6A or 6B as discussed related to FIGS. 9-11. Further, this exemplary embodiment is more cost efficient. This exemplary embodiment replaces P (or 0.5P if only decimation has to be supported) vector rotate units 220 in the rotate-and-distribute unit 270 by cell specific write control. However, this exemplary embodiment may require a single sample rotator 220 depending on the chosen manner of supporting block level software pipelining. This exemplary embodiment with generated patterns avoids the overhead of calculating them (in the typically resource limited filtering phase). Further, this exemplary embodiment also enables a user-provided write/read patterns allowing for more flexible memory access schemes.

Therefore, exemplary embodiments of the present invention provide for a parallel memory circuit/system (or multi-access memory circuit) supporting strided memory access patterns, that is rotator free in certain exemplary embodiments. The embodiments of the present invention have a particular memory bank assignment function/strategy (in which columns to write/read) and they have a particular addressing function (in/from which row=element to write/read; or how to rotate). In addition, the embodiments of the present invention support various word widths. Therefore, the embodiments of the present invention provide and for lower cost implementation.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A configurable memory circuit for a Single Instruction, Multiple Data (SIMD) Digital Signal Processor (DSP) in a wireless communications system, for generating output vectors from sequential input data vectors, comprising:
   a rotate-and-distribute unit configured to rotate and distribute input data elements of the input data vectors;
   a two-dimensional register file configured to receive and store vectors generated by the rotate-and-distribute unit;
   a write controller configured to control writing of the vectors in the two-dimensional register file by generating write-enable signals for cells of the two-dimensional register file; and
   a read controller configured to generate the output vectors by reading on a per column basis selected cells of the two-dimensional register file,
   wherein, the write controller is further configured to control the writing in the two-dimensional register file such that at least two of the input data elements pertaining to a same vector among the input data vectors are stored in cells on different rows and different columns of the two-dimensional register file.

2. The memory circuit of claim 1, wherein the rotate-and-distribute unit distributes the input data elements of the input data vectors to all columns of the two-dimensional register file.

3. The memory circuit of claim 2, wherein the rotate-and-distribute unit further comprises: a single rotate unit that performs a vertical translation of a pattern in the two-dimensional register file, based on a software pipeline stage.

4. The memory circuit of claim 1, wherein the rotate-and-distribute unit further comprises:
   a plurality of rotate units, each corresponding to one among multiple columns of the two-dimensional register file and rotating one of the input vector with a column-specific rotation.

5. The memory circuit of claim 4, further comprising:
   a plurality of left-over-addition units connected to the plurality of rotate units and configured to preserve data elements from a previous store operation when the data elements from a previous store operation exist.

6. The memory circuit of claim 5, wherein at least one of the plurality of left-over-addition units combines a previously rotated input vector with a current rotated input vector.

7. The memory circuit of claim 5, wherein the write controller generates row and column enable signals, from which write-enable signals are derived by doing a logical AND operation on the row and column enable signals specific to the cell.

8. The memory circuit of claim 4, wherein the read controller selects a row in the two-dimensional register file, to be received in the output vector.

9. The memory circuit of claim 1, wherein the input data elements are of a same word length.

10. The memory circuit of claim 1, wherein the write controller supports input data elements of differing word lengths.

11. The memory circuit of claim 1, wherein the input data vectors are of a constant vector length.

12. The memory circuit of claim 1, wherein the read and write controllers have state-machines for generating their respective control signals, based on parameters received from the SIMD DSP.

13. The memory circuit of claim 1, wherein the read and write controllers translate configuration patterns received from the SIMD DSP to respective control patterns.

14. The memory circuit of claim 13, wherein the configuration patterns are preloaded into a configuration memory.

15. The memory circuit of claim 6, wherein the read controller selects P elements from P+E column outputs stored in the two-dimensional register file and aligns them in the output vector.

16. The memory circuit of claim 15, wherein the rotate-and-distribute units have P+E logical column output vectors of which elements are stored in P+E columns of the two-dimensional register file, according to a predetermined pattern.

17. A method for generating output vectors from sequential input data vectors utilizing a configurable memory circuit for a Single Instruction, Multiple Data (SIMD) Digital Signal Processor (DSP) in a wireless communications system, the configurable memory circuit having a rotate-and-distribute unit, a two-dimensional register file, a write controller and a read controller, the method comprising:
   rotating and distributing input data elements of the input data vectors by the rotate-and-distribute unit;
   receiving and storing vectors generated by the rotate-and-distribute unit in the two-dimensional register file, writing therein being controlled by the writing controller which generates write-enable signals for cells of the two-dimensional register file; and
   generating the output vectors by the read controller which selects on a per column basis data elements stored in the two-dimensional register file,
   wherein the write controller controls the writing in the two-dimensional register file such that at least two of the input data elements pertaining to a same vector among the input data vectors are stored in cells on different rows and different columns of the two-dimensional register file.

18. The method of claim 17, wherein the rotating and distributing comprises: distributing a rotated input vector among the input vectors to all columns of the two-dimensional register file.

19. The method of claim 18, wherein the rotating and distributing further comprises:
   vertical translating a pattern in the two-dimensional register file, according to a software pipeline stage.

20. The method of claim 17, wherein the rotating and distributing comprises:

rotating one of the input vectors with a column-specific rotation each corresponding to one or multiple columns of the two-dimensional register file, using a plurality of rotate units.

21. The method of claim 20, further comprising:
preserving data elements from a previous store operation when the data elements from the previous store operation exist, using a plurality of left-over-addition units connected to the plurality of rotate units.

22. The method of claim 21, wherein the plurality of left over addition units combines a previously rotated input vector with a current rotated input vector.

23. The method of claim 22, further comprising:
generating row and column enable signals from which the write-enable signals are derived by doing a logical AND operation on the row and column enable signals specific to the cell by the write controller.

24. The method of claim 20, wherein the read controller selects a row in the two-dimensional register file, to be received in the output vector.

25. The method of claim 17, wherein the input data elements are of a same word length.

26. The method of claim 17, wherein the write controller supports input data elements of differing word lengths.

27. The method of claim 17, wherein the input data vectors are of a constant vector length.

28. The method of claim 17, wherein the read and write controllers have state-machines for generating their respective control signals, based on parameters received from the SIMD DSP.

29. The method of claim 17, wherein the read and write controllers translate configuration patterns received from the SIMD DSP to respective control patterns.

30. The method of claim 29, where the configuration patterns are preloaded into a configuration memory.

31. The method of claim 22, wherein the read controller selects P elements from P+E column outputs stored in the two-dimensional register file and aligns them into the output vector.

32. The method of claim 31, wherein P+E logical column output vectors of which elements are stored in the P+E columns of the two-dimensional register file, according to a predetermined pattern.

* * * * *